(12) United States Patent
Sugano et al.

(10) Patent No.: US 8,927,348 B2
(45) Date of Patent: Jan. 6, 2015

(54) METHOD OF MANUFACTURING GROUP-III NITRIDE SEMICONDUCTOR LIGHT-EMITTING DEVICE, AND GROUP-III NITRIDE SEMICONDUCTOR LIGHT-EMITTING DEVICE, AND LAMP

(75) Inventors: Susumu Sugano, Fujioka (JP); Hisayuki Miki, Chiba (JP); Hironao Shinohara, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 1020 days.

(21) Appl. No.: 12/992,232

(22) PCT Filed: May 12, 2009

(86) PCT No.: PCT/JP2009/058828
§ 371 (c)(1),
(2), (4) Date: Nov. 11, 2010

(87) PCT Pub. No.: WO2009/139376
PCT Pub. Date: Nov. 19, 2009

(65) Prior Publication Data
US 2011/0062479 A1 Mar. 17, 2011

(30) Foreign Application Priority Data

May 14, 2008 (JP) ................................ 2008-127750

(51) Int. Cl.
*H01L 21/20* (2006.01)
*H01L 33/00* (2010.01)
*H01L 33/22* (2010.01)
*H01L 33/16* (2010.01)
*H01L 33/20* (2010.01)

(52) U.S. Cl.
CPC ............ *H01L 33/0095* (2013.01); *H01L 33/22* (2013.01); *H01L 33/16* (2013.01); *H01L 33/20* (2013.01)
USPC ............. 438/141; 438/79; 438/510; 438/535; 438/602; 257/E21.006; 257/E21.042; 257/E21.053; 257/E21.126; 257/E21.157; 257/E21.17; 257/E21.237; 257/E21.246; 257/E21.328; 257/E21.347; 257/E21.352

(58) Field of Classification Search
USPC ............... 438/141, 79, 82, 99, 510, 602, 603, 438/604, 328, 535, 745; 257/E21.006, 257/E21.042, E21.053, E21.126, E21.127, 257/E21.157, E21.17, E21.237, E21.246, 257/E21.328, E21.347, E21.352
See application file for complete search history.

(56) References Cited

U.S. PATENT DOCUMENTS

| 8,110,423 B2 * | 2/2012 | Okabe ............................. 438/33 |
| 8,389,312 B2 * | 3/2013 | Yoshizumi et al. ............. 438/33 |
| 8,507,305 B2 * | 8/2013 | Yoshizumi et al. ............. 438/47 |

FOREIGN PATENT DOCUMENTS

| JP | 06-291368 A | 10/1994 |
| JP | 9-129559 A | 5/1997 |

(Continued)

OTHER PUBLICATIONS

Notice of Allowance with a mailing date of May 7, 2014 for corresponding JP Application No. 2010-511980.

(Continued)

*Primary Examiner* — David Nhu
(74) *Attorney, Agent, or Firm* — Sughrue Mion, PLLC

(57) ABSTRACT

Provided are a method of manufacturing a group-III nitride semiconductor light-emitting device in which a light-emitting device excellent in the internal quantum efficiency and the light extraction efficiency can be obtained, a group-III nitride semiconductor light-emitting device and a lamp. Included are an epitaxial step of forming a semiconductor layer (30) so as to a main surface (20) of a substrate (2), a masking step of forming a protective film on the semiconductor layer (30), a semiconductor layer removal step of removing the protective film and the semiconductor layer (30) by laser irradiation to expose the substrate (2), a grinding step of reducing the thickness of the substrate (2), a polishing step of polishing the substrate (2), a laser processing step of providing processing marks to the inside of the substrate (2), a division step of creating a plurality of light-emitting devices (1) while forming a division surface of the substrate (2) to have a rough surface.

8 Claims, 12 Drawing Sheets

(56) References Cited

FOREIGN PATENT DOCUMENTS

| | | |
|---|---|---|
| JP | 2836687 B2 | 10/1998 |
| JP | 2836687 B2 | 12/1998 |
| JP | 2001-160539 A | 6/2001 |
| JP | 2001-308010 A | 11/2001 |
| JP | 2002-261396 A | 9/2002 |
| JP | 2002-280611 A | 9/2002 |
| JP | 2003-218065 A | 7/2003 |
| JP | 2003-258381 A | 9/2003 |
| JP | 2003-338468 A | 11/2003 |
| JP | 2005-142278 A | 6/2005 |
| JP | 2005-150675 A | 6/2005 |
| JP | 2006-179768 A | 7/2006 |
| JP | 2006-245062 A | 9/2006 |
| JP | 2006-253402 A | 9/2006 |
| JP | 2006-253670 A | 9/2006 |
| JP | 2007-116153 A | 5/2007 |
| JP | 2007-251112 A | 9/2007 |
| JP | 2007-300134 A | 11/2007 |
| JP | 2007-329459 A | 12/2007 |
| JP | 2008-53385 A | 3/2008 |
| JP | 2008-98224 A | 4/2008 |
| JP | 2008-109084 A | 5/2008 |
| WO | 2005096399 A1 | 10/2005 |
| WO | 2008004437 A1 | 1/2008 |

OTHER PUBLICATIONS

Office Action with a mailing date of Mar. 12, 2013 for corresponding Japanese Patent Application No. 2010-511980.
Office Action with a mailing date of Nov. 5, 2013 for corresponding Japanese Patent Application No. 2010-511980.

* cited by examiner

METHOD OF MANUFACTURING GROUP-III NITRIDE SEMICONDUCTOR LIGHT-EMITTING DEVICE, AND GROUP-III NITRIDE SEMICONDUCTOR LIGHT-EMITTING DEVICE, AND LAMP

CROSS REFERENCE TO RELATED APPLICATIONS

This application is a National Stage of International Application No. PCT/JP2009/058828 filed May 12, 2009, claiming priority based on Japanese Patent Application No. 2008-127750 filed May 14, 2008, the contents of all of which are incorporated herein by reference in their entirety.

TECHNICAL FIELD

The present invention relates to a method of manufacturing a group-III nitride semiconductor light-emitting device in which a group-III nitride semiconductor is laminated, a group-III nitride semiconductor light-emitting device, and a lamp which are suitably used in a light-emitting diode (LED), a laser diode (LD), an electronic device and the like.

BACKGROUND ART

A group-III nitride semiconductor has a direct transition-type band gap of an energy equivalent to a range of an ultraviolet light region from visible light, is commercialized as a semiconductor light-emitting devices such as a light-emitting diode (LED) or a laser diode (LD) because of an excellent emission efficiency, and is used for various applications. In addition, even when used in electronic devices, the group-III nitride semiconductor has the potential of obtaining more excellent properties than when the groups-III-V compound semiconductor of the related art is used.

Such a group-III nitride semiconductor is generally manufactured by a molecular beam epitaxy (MBE) method, in addition to those manufactured by a metalorganic chemical vapor deposition (MOCVD) method, using trimethyl gallium, trimethyl aluminum and ammonia as raw materials. The MOCVD method is a method of growing a crystal by containing vapor of the raw materials in a carrier gas to carry the vapor to the surface of a substrate, and decomposing the raw materials at the heated surface of the substrate.

In the general light-emitting devices in which a group-III nitride semiconductor is used, an n-type semiconductor layer, an emission layer and a p-type semiconductor layer, which are made of a group-III nitride semiconductor, are laminated on a sapphire single-crystal substrate in this order. Since the sapphire substrate is an insulator, the structure of the device generally has a structure in which a positive electrode formed on a p-type semiconductor layer and a negative electrode formed on an n-type semiconductor layer exist on the same surface. In such a group-III nitride semiconductor light-emitting device, there are two types of devices of a face-up type of extracting light from the p-type semiconductor side by using a transparent electrode in the positive electrode, and a flip-chip type of extracting light from the sapphire substrate side using a high reflective film made of Ag and the like in the positive electrode.

As a barometer of the output of the light-emitting device mentioned above, the external quantum efficiency is generally used. If the external quantum efficiency is high, it can be said that the light-emitting device has a high emission output. In addition, the term "external quantum efficiency" means a barometer of multiplication of the internal quantum efficiency by the light extraction efficiency, and the term "internal quantum efficiency" means the ratio of conversion of energy of a current implanted in the device into light at the emission layer. In addition, the term "light extraction efficiency" means the ratio of light capable of being extracted to the outside of the light-emitting device in light which is generated at the emission layer. Therefore, it is necessary to improve the light extraction efficiency in order to enhance the external quantum efficiency.

As methods of improving the light extraction efficiency, there are mainly two methods. One is a method of reducing the absorption of light by an electrode and the like formed on the light extraction surface, and the other is a method of reducing the confinement of light into the inside of the light-emitting device generated due to a difference of refractive indexes between the light-emitting device and the external medium thereof.

In addition, as a method of reducing the confinement of light into the inside of the light-emitting device, a technique for forming the asperity on the light extraction surface of the light-emitting device is proposed (see, for example, Patent Document 1).

However, in the light-emitting device in which the asperity is formed on the light extraction surface by mechanical processing or chemical processing as disclosed in Patent Document 1, there may be a concern that the load is applied to the semiconductor layer by performing processing on the light extraction surface, and thus damage remains in the emission layer. In addition, in the light-emitting device in which the semiconductor layer is grown in the manufacturing conditions of forming the asperity on the light extraction surface, crystallization of the semiconductor layer is deteriorated, and thus defects are included in the emission layer. For this reason, when the asperity is formed on the light extraction surface, there has been a problem that while the light extraction efficiency is improved, the internal quantum efficiency is lowered, and thus the emission intensity cannot be enhanced.

Consequently, instead of a method of forming the asperity on the light extraction surface, there is proposed a method of forming the asperity on the surface of a sapphire substrate, and growing a group-III nitride semiconductor layer thereon (see, for example, Patent Document 2). According to this method, the asperity is formed at the interface between the sapphire substrate and the group-III nitride semiconductor layer, and thus it is possible to reducing the confinement of light into the inside of the light-emitting device due to the diffused reflection of light generated at the interface by a difference of refractive indexes between the sapphire substrate and the group-III nitride semiconductor layer, and to improve the light extraction efficiency.

However, in the method disclosed in Patent Document 2, there has been a problem that while the light extraction efficiency from the semiconductor layer on the sapphire substrate can be improved, the light extraction efficiency from the sapphire substrate cannot be improved.

Further, there is known the light-emitting device in which the lateral side of the group-III nitride semiconductor layer is inclined with respect to a normal line of the main surface of the substrate, in order to provide the light-emitting device having a high light extraction efficiency (see, for example, Patent Document 3). Patent Document 3 discloses the use of a laser as means for removing the nitride semiconductor layer until it reaches the substrate.

On the other hand, as a method of dividing a wafer into individual devices, there is proposed a method of forming a reforming region through laser irradiation focusing a light collecting point on the inside of the substrate of the wafer on which the semiconductor layer is laminated, forming a cutting start point region through this reforming region, and cutting the wafer along the cutting start point region (see, for example, Patent Documents 4 and 5).

[Patent Document 1] Japanese Patent No. 2836687
[Patent Document 2] Japanese Unexamined Patent Application Publication No. 2002-280611
[Patent Document 3] Japanese Unexamined Patent Application Publication No. 2006-253670
[Patent Document 4] Japanese Unexamined Patent Application Publication No. 2003-338468
[Patent Document 5] Japanese Unexamined Patent Application Publication No. 2006-245062

DISCLOSURE OF INVENTION

That is, Patent Documents 4 and 5 disclose a laser processing method in which when the wafer is divided, an altered part is provided to the inside of the sapphire substrate by laser irradiation, and then the wafer is divided into light-emitting device chip units. However, in such a method, there has been a problem that at the time of division, damage due to laser processing is given to the group-III nitride semiconductor layer, leading to lowering in the emission property or occurrence of electrical leakage and the like.

The invention is devised in view of the above problems, and an object of the invention is to provide a method of manufacturing a group-III nitride semiconductor light-emitting device capable of manufacturing a light-emitting device which is excellent in the internal quantum efficiency and light extraction efficiency, and is excellent in the productive efficiency.

In addition, another object of the invention is to provide a group-III nitride semiconductor light-emitting device which has excellent internal quantum efficiency and light extraction efficiency, and has a high emission property, and a lamp in which this light-emitting device is used.

Solution to Problem

The inventors and others have found, as a result of assiduous study for the purpose of improving the light extraction efficiency of the light-emitting device in which a group-III nitride semiconductor is formed on the substrate, that a semiconductor layer is formed on the substrate by sequentially laminating an n-type semiconductor layer, and emission layer and a p-type semiconductor layer which are made of at least a group-III nitride semiconductor, the semiconductor layer is removed by the first laser irradiation to expose the main surface of the substrate and/or form a groove in a portion of the substrate, and then processing marks generated by the second laser irradiation process are provided to the inside of the substrate, and the substrate is divided using these processing marks, so that a light-emitting device excellent in light extraction efficiency can be manufactured with a higher productive efficiency without giving damage to the semiconductor layer, and has completed the invention.

That is, the invention provides the following.

[1] A method of manufacturing a group-III nitride semiconductor light-emitting device in which a semiconductor layer is formed on a substrate by sequentially laminating an n-type semiconductor layer, an emission layer and a p-type semiconductor layer, which are made of a group-III nitride semiconductor, the method including: an epitaxial step of epitaxially growing the group-III nitride semiconductor on a first main surface of the substrate, to form the semiconductor layer so as to cover the main surface; a masking step (protective film forming step) of forming a protective film on the semiconductor layer; a semiconductor layer removal step of irradiating a cutting expectation line (scribing line) for dividing the substrate into a plurality of chips with a laser from the side on which the semiconductor layer and the protective film of the substrate are formed, to remove the protective film and the semiconductor layer and expose the substrate; a grinding step of grinding a second main surface of the substrate, to reduce the thickness of the substrate; a polishing step of polishing (lapping) the substrate after the grinding step; a laser processing step of irradiating the cutting expectation line with a laser, to provide processing marks to the inside of the substrate; and a division step of dividing the substrate along the processing marks and the cutting expectation line, to create a plurality of chips while forming a division surface of the substrate to have a rough surface.

[2] The method of manufacturing a group-III nitride semiconductor light-emitting device according to the above [1], wherein the first main surface of the substrate comprises a flat surface of a C-plane and a plurality of raised portions formed on the C-plane.

[3] The method of manufacturing a group-III nitride semiconductor light-emitting device according to the above [1] or [2], wherein the substrate is a substrate in which a plane orientation of the substrate surface has an off-angle within a range of ±3° from the (0001) direction.

[4] The method of manufacturing a group-III nitride semiconductor light-emitting device according to any one of the above [1] to [3], wherein the laser processing step includes performing the laser irradiation from the second main surface side and/or the first main surface side of the substrate.

[5] The method of manufacturing a group-III nitride semiconductor light-emitting device according to any one of the above [1] to [4], wherein the laser processing step includes providing the processing marks to a region from a irradiation surface of the laser in the substrate to a ⅔ portion in the thickness direction thereof.

[6] The method of manufacturing a group-III nitride semiconductor light-emitting device according to any one of the above [1] to [5], wherein in the laser processing step, laser irradiates the substrate using pulse irradiation.

[7] The method of manufacturing a group-III nitride semiconductor light-emitting device according to any one of the above [1] to [6], wherein in the laser processing step, a wavelength of the laser is 266 nm or 355 nm.

[8] The method of manufacturing a group-III nitride semiconductor light-emitting device according to any one of the above [1] to [7], wherein in the semiconductor layer removal step, laser removes the semiconductor layer using pulse irradiation.

[9] The method of manufacturing a group-III nitride semiconductor light-emitting device according to any one of the above [1] to [8], wherein the semiconductor layer removal step includes setting the emission wavelength of the laser to 266 nm or 355 nm.

[10] The method of manufacturing a group-III nitride semiconductor light-emitting device according to any one of the above [1] to [9], further comprising an etching step of etching the lateral side of the semiconductor layer in which a portion along the scribing line for dividing the substrate is removed between the semiconductor layer removal step and the grinding step by the semiconductor layer removal step.

[11] The method of manufacturing a group-III nitride semiconductor light-emitting device according to the above [10], wherein the etching step uses wet etching by immersing the semiconductor layer in a phosphoric acid treatment solution.

[12] The method of manufacturing a group-III nitride semiconductor light-emitting device according to the above [10]

or [11], wherein the etching step includes forming the lateral side of the semiconductor layer in a reversely-inclined plane shape which is reversely inclined from the first main surface of the substrate toward the side on which the semiconductor layer is formed.

[13] The method of manufacturing a group-III nitride semiconductor light-emitting device according to any one of the above [1] to [12], further comprising a temporary fixing step of attaching a temporary fixing sheet made of a resin to either of the substrate side or the semiconductor layer side, between the polishing step and the laser processing step, and a sheet peeling step of, after the plurality of chips is separated from each other by heating and expanding the temporary fixing sheet subsequently to the division step, detaching the chips from the temporary fixing sheet.

[14] The method of manufacturing a group-III nitride semiconductor light-emitting device according to any one of the above [1] to [13], further comprising a buffer layer forming step of laminating a buffer layer made of $Al_xGa_{1-x}N$ ($1 \geq X \geq 0$) on the first main surface of the substrate by a reactive sputtering method so as to cover the first main surface, before at least the epitaxial step, wherein the semiconductor layer removal step includes irradiating the cutting expectation line for dividing the substrate into a plurality of chips with a laser from the side on which the semiconductor layer and the protective film of the substrate are formed, to remove the protective film, the semiconductor layer and the buffer layer and expose the substrate, and the etching step includes etching the lateral sides of the semiconductor layer and the buffer layer on which a portion along the scribing line for dividing the substrate is removed in the semiconductor layer removal step.

[15] The method of manufacturing a group-III nitride semiconductor light-emitting device according to the above [14], wherein in the buffer layer forming step, the buffer layer is formed at a thickness of 0.01 to 0.5 μm.

[16] The method of manufacturing a group-III nitride semiconductor light-emitting device according to the above [14] or [15], wherein in the buffer layer forming step, the buffer layer is formed in a single crystal.

[17] The method of manufacturing a group-III nitride semiconductor light-emitting device according to the above [14] or [15], wherein in the buffer layer forming step, the buffer layer is formed in a poly crystal.

[18] The method of manufacturing a group-III nitride semiconductor light-emitting device according to any one of the above [1] to [17], further comprising an electrode forming step of, between the epitaxial step and the masking step, forming a plurality of translucent positive electrodes at a predetermined position on the p-type semiconductor layer and then forming a plurality of positive electrode bonding pads on each of the translucent positive electrodes, and exposing the n-type semiconductor layer to form a plurality of negative electrode forming regions by etching and removing a predetermined position of the semiconductor layer, to form a plurality of negative electrode bonding pads in each of the negative electrode forming regions.

[19] The method of manufacturing a group-III nitride semiconductor light-emitting device according to any one of the above [1] to [18], wherein the substrate is a sapphire substrate.

[20] The method of manufacturing a group-III nitride semiconductor light-emitting device according to any one of the above [1] to [19], wherein the thickness of the substrate is equal to or more than 100 μm.

[21] A group-III nitride semiconductor light-emitting device obtained by the manufacturing method according to any one of the above [1] to [20].

[22] A group-III nitride semiconductor light-emitting device in which a semiconductor layer is formed on the substrate, the semiconductor layer having an n-type semiconductor layer, an emission layer and the p-type semiconductor layer sequentially laminated, which are made of a group-III nitride semiconductor, wherein the substrate has a first main surface constituted by a flat surface of a C-plane and a plurality of raised portions formed on the C-plane, the semiconductor layer is formed so as to cover the main surface by epitaxially grow the group-III nitride semiconductor on the main surface, the lateral side of the semiconductor layer is formed in a reversely-inclined plane shape which is reversely-inclined from the first main surface of the substrate toward the upper portion thereof, and the end surface of the substrate is formed to have a rough surface.

[23] The group-III nitride semiconductor light-emitting device according to the above [22], wherein the substrate is a substrate in which a plane orientation of a substrate surface has an off-angle within a range of ±3° from the (0001) direction.

[24] The group-III nitride semiconductor light-emitting device according to the above [22] or [23], wherein the end surface of the substrate is formed to have a rough surface by processing marks provided to the inside of the substrate through laser processing, the substrate is divided along the processing marks to thereby be formed to have a rough surface.

[25] The group-III nitride semiconductor light-emitting device according to any one of the above [22] to [24], wherein between the substrate and the semiconductor layer, a buffer layer made of $Al_xGa_{1-x}N$ ($1 \geq X \geq 0$) is formed on the first main surface of the substrate by a reactive sputtering method so as to cover the first main surface.

[26] The group-III nitride semiconductor light-emitting device according to the above [25], wherein each of the lateral sides of the semiconductor layer and the buffer layer is formed in a reversely-inclined plane shape which is reversely-inclined from the first main surface of the substrate toward the upper portion thereof.

[27] The group-III nitride semiconductor light-emitting device according to the above [25] or [26], wherein the thickness of the buffer layer is set to a range of 0.01 to 0.5 μm.

[28] The group-III nitride semiconductor light-emitting device according to any one of [25] to [27], wherein the buffer layer is a single crystal.

[29] The group-III nitride semiconductor light-emitting device according to claim 25, wherein the buffer layer is a poly crystal.

[30] The group-III nitride semiconductor light-emitting device according to any one of the above [22] to [29], wherein a translucent positive electrode is formed on the p-type semiconductor layer, a positive electrode bonding pad is formed on the translucent positive electrode, and a negative electrode bonding pad is formed in a negative electrode forming region to which a predetermined position of the n-type semiconductor layer is exposed.

[31] The group-III nitride semiconductor light-emitting device according to any one of the above [22] to [30], wherein the substrate is a sapphire substrate.

[32] The group-III nitride semiconductor light-emitting device according to any one of the above [22] to [31], wherein the thickness of the substrate is set to equal to or more than 100 μm.

[33] The group-III nitride semiconductor light-emitting device according to any one of the above [22] to [32], the raised portion of the substrate is 0.05 to 5 μm in width of the basal portion, and 0.05 to 5 μm in height, the height being equal to or more than ¼ times the basal portion width, and the interval between the adjacent raised portions is 0.5 to 5 times the basal portion width.

[34] The group-III nitride semiconductor light-emitting device according to any one of the above [22] to [33], wherein the raised portion of the substrate is such that the external contour becomes gradually smaller in an upward direction.

[35] The group-III nitride semiconductor light-emitting device according to any one of the above [22] to [34], wherein the raised portion of the substrate is formed in an approximately conical shape, or in an approximately polygonal pyramid shape.

[36] A lamp in which the group-III nitride semiconductor light-emitting device according any one of the above [21] to [35] is used.

A method of manufacturing a group-III nitride semiconductor device includes an epitaxial step, a masking step (protective film forming step) of forming the protective film, a semiconductor layer removal step of removing the protective film and the semiconductor layer by laser irradiation, a grinding step of reducing the thickness of the substrate, a polishing step of polishing the substrate, a laser processing step of providing the processing marks to the inside of the substrate, and a division step of forming the division surface of the substrate to have a rough surface. Therefore, it is possible to form the end surface of the substrate to have a rough surface without giving damage to the semiconductor layer and without lowering the device characteristics, as a result, to raising the internal quantum efficiency and the light extraction efficiency, and to manufacture the group-III nitride semiconductor light-emitting device having a high emission output.

Further, according to the manufacturing method of the embodiment, when the groove is formed in the substrate by laser irradiation in the semiconductor layer removal step, it is possible to reduce the warpage of the substrate included in the light-emitting device, and to considerably reduce the warpage of the substrate after the grinding step and the polishing step by controlling the granularity of abrasive grains used in the grinding step and the polishing step.

In addition, according to the manufacturing method of the embodiment, it is possible to manufacture the light-emitting device with a high degree of accuracy and with a high productive efficiency (high yield rate) by two irradiation steps (semiconductor layer removal step and laser processing step), in virtue of the contribution of the above-mentioned effects.

As a result, it is possible to realize a group-III nitride semiconductor light-emitting device having a high emission output which is excellent in the internal quantum efficiency and the light extraction efficiency according to the manufacturing method of the invention.

Further, according to the group-III nitride semiconductor device of the invention, it is possible to provide the light-emitting device in which the substrate includes the main surface constituted by the flat surface of the C-plane and a plurality of raised portions formed on the C-plane, and the semiconductor layer is formed so as to cover the first main surface by epitaxially growing a group-III nitride semiconductor on the main surface, so that confinement of light into the inside of the light-emitting device is reduced by diffused reflection of light in the interface, and confinement of light into the inside of the light-emitting device is reduced by forming the lateral side of the semiconductor layer in a reversely-inclined plane shape which is reversely-inclined from the first main surface of the substrate toward the side (upper portion) on which the semiconductor layer is formed, and further, the end surface of the substrate the divided light-emitting device is formed to have a rough surface, so that the light-emitting device has a higher emission output than that of the related art by the special effect that light propagating in the substrate is efficiently emitted to the outside.

Further, the invention can provide a lamp having a high emission property by using the group-III nitride semiconductor light-emitting device according to the invention mentioned above.

BEST MODE FOR CARRYING OUT THE INVENTION

Figure 1:
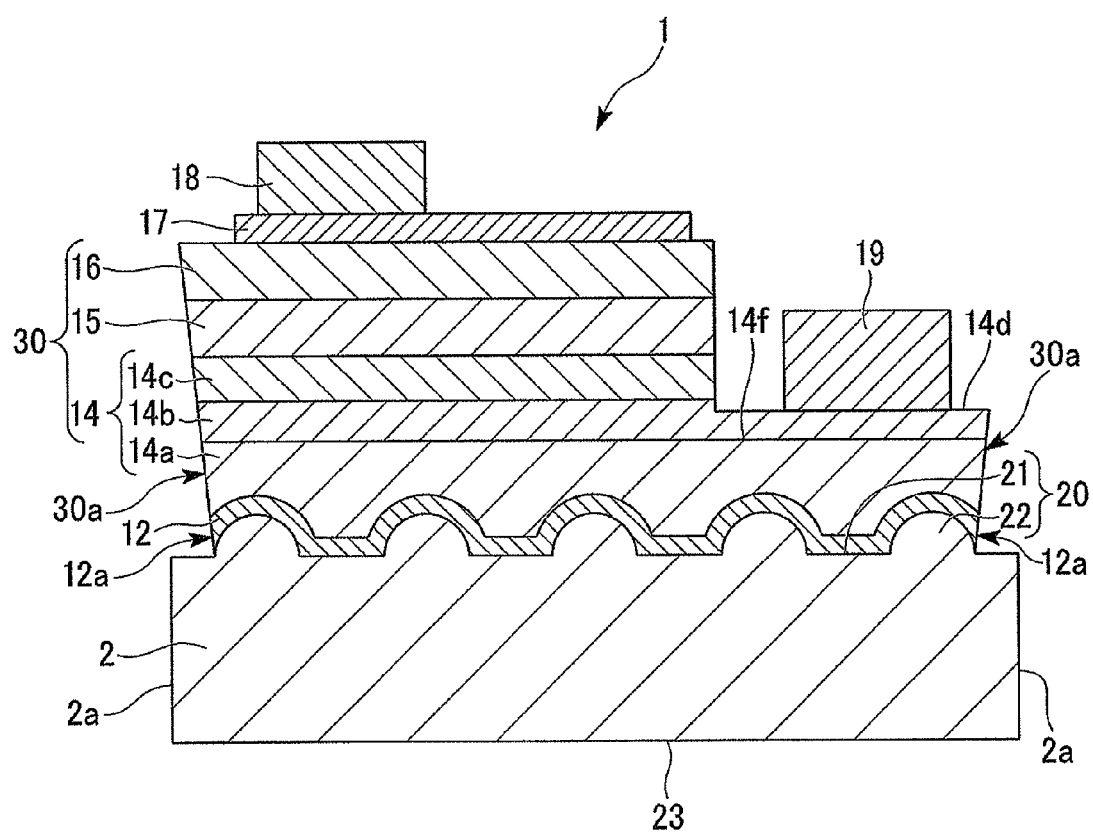
FIG. 1 is a diagram schematically explaining an example of a group-III nitride semiconductor light-emitting device according to the invention, and a schematic diagram illustrating a cross-sectional structure.
Figure 2:
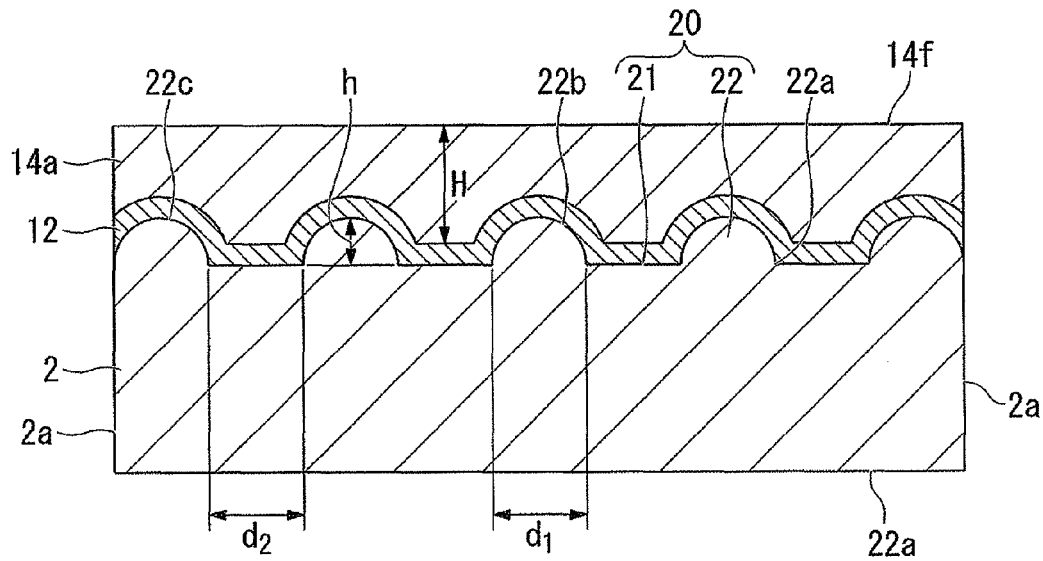
FIG. 2 is a diagram schematically explaining an example of the group-III nitride semiconductor light-emitting device according to the invention, and a partial cross-sectional view illustrating a cross-sectional shape of a substrate.
Figure 3:
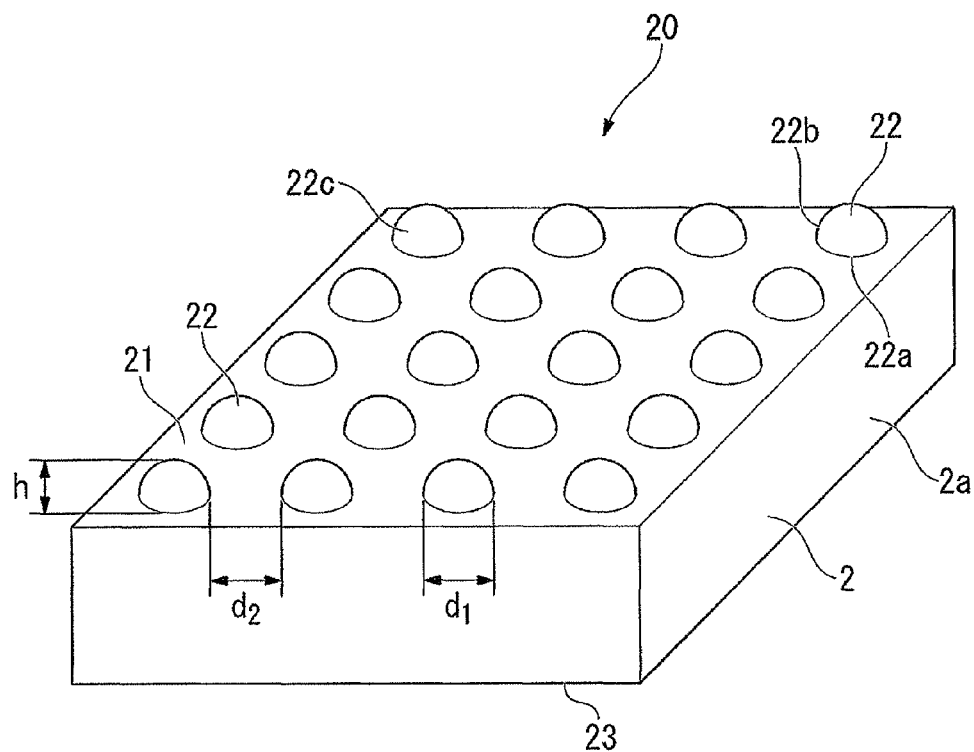
FIG. 3 is a diagram schematically explaining an example of the group-III nitride semiconductor light-emitting device according to the invention, and a perspective view illustrating a shape of the main surface of the substrate.
Figure 4:
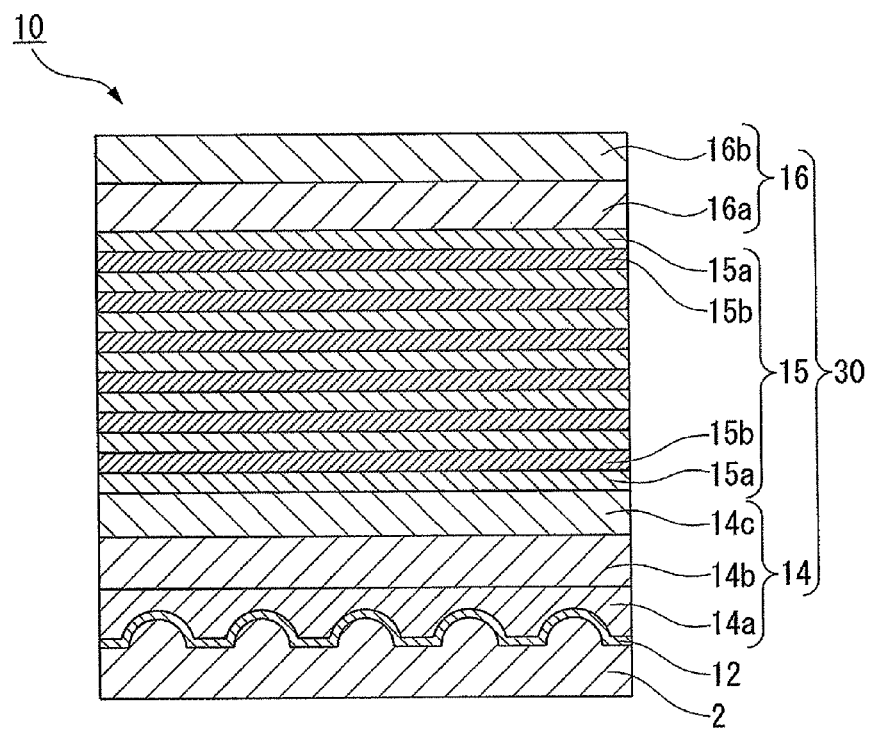
FIG. 4 is a diagram schematically explaining an example of the group-III nitride semiconductor light-emitting device according to the invention, and a schematic diagram illustrating a cross-sectional structure of a laminated semiconductor.
Figure 14:
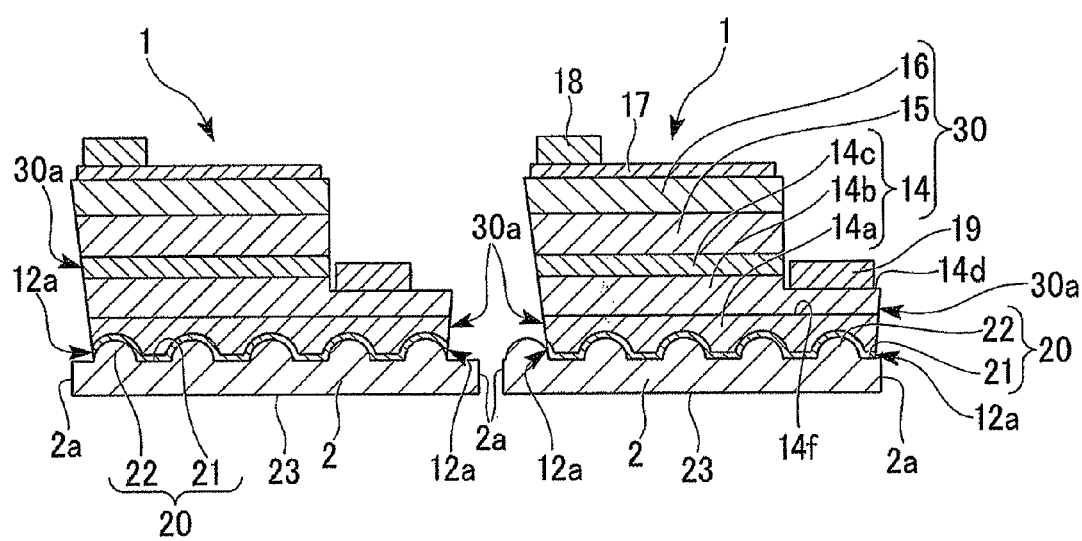
FIG. 14 is a diagram schematically explaining an example of the method of manufacturing the group-III nitride semiconductor light-emitting device according to the invention, a cross-sectional view illustrating a sheet peeling step, and a schematic diagram illustrating a state where a plurality of light-emitting devices is peeled from a sheet.
Figure 15:
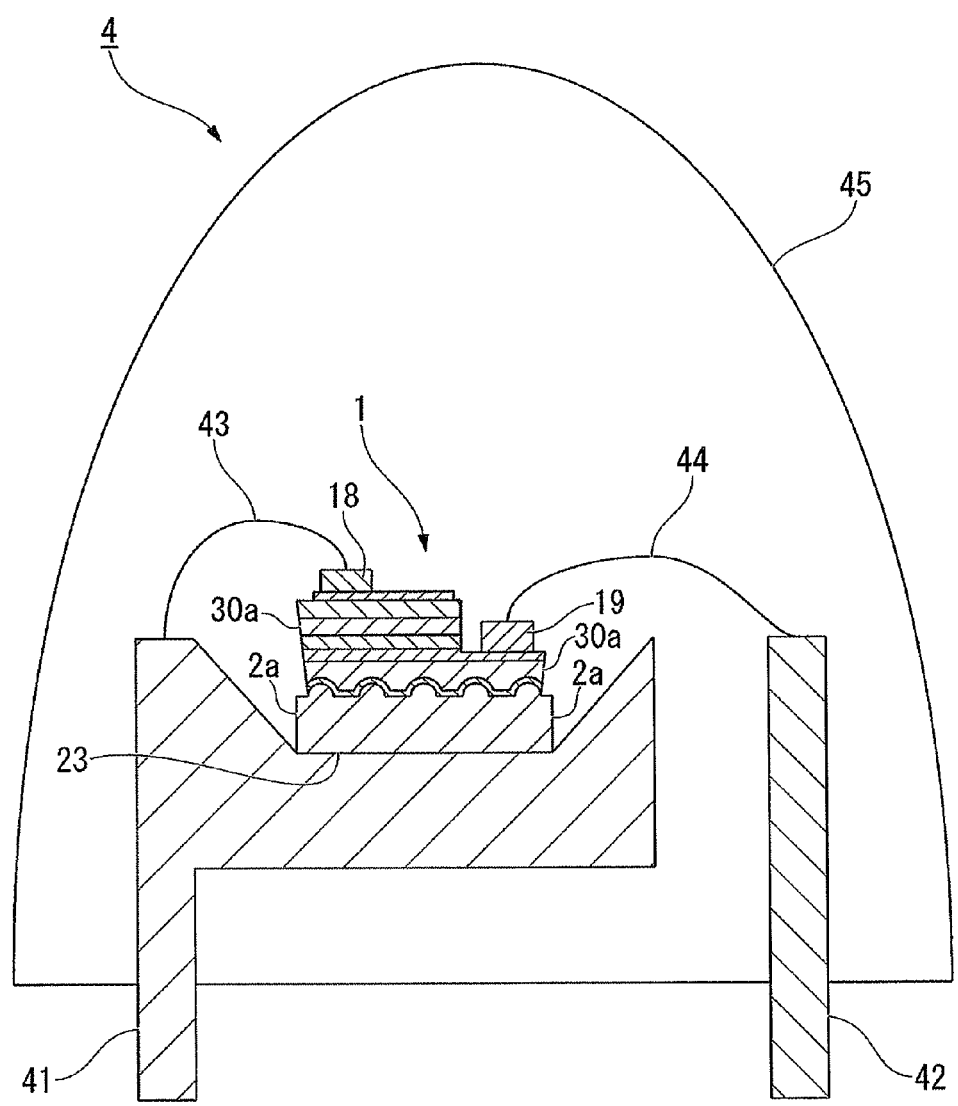
FIG. 15 is a schematic diagram schematically explaining a lamp which is formed using the group-III nitride semiconductor light-emitting device according to the invention.

Hereinafter, reference is properly made to FIGS. 1 to 14 to describe a method of manufacturing a group-III nitride semiconductor light-emitting device, a group-III nitride semiconductor light-emitting device, and a lamp which are embodiments of the invention. FIG. 1 is a cross-sectional view illustrating the group-III nitride semiconductor light-emitting device of the embodiment, FIG. 2 is a cross-sectional view for explaining a process of laminating a buffer layer and an underlying layer made of a group-III nitride semiconductor on the first main surface of a substrate provided with a raised portion, FIG. 3 is a perspective view illustrating the first main surface of the substrate provided with the raised portion shown in FIG. 2, FIG. 4 is a cross-sectional view illustrating a laminated semiconductor included in the light-emitting device shown in FIG. 1 in more detail, FIGS. 5 to 13 are process diagrams for explaining each process of the method of manufacturing the group-III nitride semiconductor light-emitting device of the embodiment, FIG. 14 is a schematic diagram illustrating an example of forming a semiconductor layer in a reverse tapered shape, and FIG. 15 is a schematic diagram illustrating the lamp in which the light-emitting device shown in FIG. 1 is used.

Group-III Nitride Semiconductor Light-Emitting Device

A group-III nitride semiconductor device (hereinafter, often abbreviated to a light-emitting device) 1 of the embodiment is schematically configured such that a semiconductor layer 30 in which an n-type semiconductor layer 14, an emission layer 15 and a p-type semiconductor layer 16, which are made of a group-III nitride semiconductor, are sequentially laminated is formed on a substrate 2, the substrate 2 includes a main surface (first main surface) 20 constituted by a flat surface 21 of the C-plane and a plurality of raised portions 22 formed on the C-plane, the semiconductor layer 30 is formed so as to cover the main surface 20 constituted by the flat surface 21 and the raised portions 22 by epitaxially growing the semiconductor layer 30 made of a group-III nitride semiconductor on this main surface 20, and an end surface 2a of the substrate 2 is formed to have a rough surface of which the details are described later. In addition, the light-emitting device 1 described in the embodiment is configured such that a translucent positive electrode 17 is formed on a p-type semiconductor layer 16, a positive electrode bonding pad 18 is formed on this translucent positive electrode 17, and a negative electrode bonding pad 19 is formed on a negative electrode forming region 14d to which an n-type contact layer 14b is exposed in the n-type semiconductor layer 14 (see the light-emitting device 1 shown in FIG. 1 and a laminated semiconductor 10 shown in FIG. 4). In addition, the light-emitting device 1 exemplified in FIG. 1 is configured such that a buffer layer 12 is formed between the substrate 2 and the n-type semiconductor layer 14. In addition, the exemplified light-emitting device 1 is configured such that the lateral side 30a of the semiconductor layer 30 (n-type semiconductor layer 14, emission layer 15 and p-type semiconductor layer 16) and the lateral side 12a of the buffer layer 12 are formed in a reversely-inclined plane shape which is reversely inclined from over the substrate 2 toward the upper portion thereof.

The light-emitting device 1 of the embodiment is formed of a one-surface electrode type light-emitting device exemplified in FIG. 1 through the above-mentioned configuration.

Laminated Structure

FIG. 4 is a diagram for explaining an example of the group-III nitride semiconductor device according to the invention, and a cross-sectional view schematically illustrating an example of the laminated semiconductor in which the group-III nitride semiconductor is formed on the substrate.

The laminated semiconductor 10 shown in FIG. 4 is configured such that the buffer layer 12 made of a group-III nitride is laminated on the substrate 2, and in the shown example, the n-type semiconductor layer 14 (underlying layer 14a) is formed on the buffer layer 12. In addition, in the exemplified laminated semiconductor 10, the emission layer 15 and the p-type semiconductor layer 16 are further laminated sequentially on the n-type semiconductor layer 14, and an LED structure (semiconductor layer 30) having each of these layers is formed.

Hereinafter, the laminated structure of the group-III nitride semiconductor light-emitting device of the embodiment will be described in detail.

Substrate

Material of the Substrate

The material of the substrate 2 is not particularly limited insofar as it is a material causing a group-III nitride semiconductor crystal to epitaxially grow on the surface thereof, and can be used by selecting various types of materials. However, in the invention, it is preferable to use a sapphire from the viewpoint of the characteristics of processing in a laser processing step or a process of forming the raised portions on the substrate, which is mentioned later. In addition, it is preferable to use the materials having a hexagonal structure like a sapphire in the substrate from the viewpoint that a group-III nitride semiconductor having good crystallization can be laminated.

In addition, although a substrate having a diameter of 2 inches or so is typically used, a substrate having a diameter of 4 to 6 inches can also be used in the group-III nitride semiconductor device of the invention.

In addition, a substrate in which a plane orientation of the substrate surface has an off-angle within a range of ±3° from the (0001) direction can be used as the substrate used in the invention.

(Shape of the Substrate: the Main Surface Constituted by the Flat Surface and the Raised Portions)

On the substrate 2 used in the embodiment, a plurality of raised portions 22 is formed as shown in FIG. 3. The portion of the main surface (first main surface) 20 of the substrate 2 on which the raised portions 22 are not formed serves as the flat surface 21 of the (0001) C-plane. Therefore, as shown in FIGS. 2 and 3, the main surface 20 of the substrate 2 is constituted by the flat surface 21 of the C-plane, and a plurality of raised portions 22.

As shown in FIGS. 2 and 3, the raised portion 22 has a surface 22c nonparallel to the C-plane, and the C-plane does not appear in this surface 22c. The raised portion 22 shown in FIGS. 2 and 3 is configured such that the planar shape of the basal portion 22a is approximately circular, the external contour becomes gradually smaller in an upward direction, and the lateral side 22b has an outwardly curved bowl-like (hemispherical) shape.

In addition, the planar arrangement of the raised portions 22 takes a grid-shaped formation of regular intervals as shown in FIGS. 2 and 3.

In addition, the raised portion 22 shown in FIGS. 2 and 3 has a basal portion width $d_1$ of 0.05 to 5 μm and a height h of 0.05 to 5 μm, the height h being equal to or larger than ¼ of the basal portion width $d_1$, and the interval $d_2$ between the adjacent raised portions 22 is 0.5 to 5 times the basal portion width $d_1$. Here, the term "basal portion width $d_1$ of the raised portion 22" refers to a length of the maximum width in the base (basal portion 22a) of the raised portion 22. In addition, the term "interval $d_2$ between the adjacent raised portions 22" refers to a distance between the edges of the basal portions 22a of the nearest raised portions 22.

The interval $d_2$ between the adjacent raised portions 22 is preferably 0.5 to 5 times the basal portion width $d_1$. If the interval $d_2$ between the raised portions 22 is smaller than 0.5 times the basal portion width $d_1$, then there may be a case where upon epitaxially growing the underlying layer 14a included in the n-type semiconductor layer 14 (semiconductor layer 30), crystal growth from the top of the flat surface 21 of the C-plane is not easily promoted, which makes it difficult to completely bury the raised portions 22 in the underlying layer 14a, and thus flatness of the surface 14f of the underlying layer 14a is not sufficiently obtained.

Therefore, when a crystal of the semiconductor layer having an LED structure is formed on the underlying layer 14a by burying the raised portion 22, many pits are naturally formed in this crystal, which leads to deterioration of the output or the electrical characteristics and the like of the group-III nitride semiconductor light-emitting device to be formed. In addition, if the interval $d_2$ between the raised portions 22 exceeds 5 times the basal portion width $d_1$, then there may be a concern that upon formation of the group-III nitride semiconductor light-emitting device using the substrate 2, diffused reflection of light is less likely to occur in the interface between the substrate 2 and the group-III nitride semiconductor layer formed on the substrate 2, whereby the light extraction efficiency may not be sufficiently improved.

The basal portion width $d_1$ is preferably 0.05 to 5 μm. If the basal portion width $d_1$ is smaller than 0.05 μm, then upon formation of the group-III nitride semiconductor light-emitting device using the substrate 2, there may be a concern that the effect of the diffused reflection of light will not be sufficiently obtained. In addition, if the basal portion width $d_1$ exceeds 5 μm, then it is difficult to epitaxially grow the underlying layer 14a by burying the raised portion 22.

The height h of the raised portion 22 is preferably 0.05 to 5 μm. If the height h of the raised portion 22 is smaller than 0.05 μm, then upon formation of the group-III nitride semiconductor light-emitting device using the substrate 2, there may be a concern that the effect of the diffused reflection of light will not be sufficiently obtained. In addition, if the height h of the raised portion 22 exceeds 5 μm, then there may be a case where it is difficult to epitaxially grow the underlying layer 14a by burying the raised portion 22, and thus flatness of the surface 14a of the underlying layer 14a may not be sufficiently obtained.

In addition, the height h of the raised portion 22 is preferably equal to or larger than ¼ of the basal portion width $d_1$. If the height h of the raised portion 22 is smaller than ¼ of the basal portion width $d_1$, then there may be a concern that upon formation of the group-III nitride semiconductor light-emitting device using the substrate 2, the effect of the diffused reflection of light, or the effect of improving the light extraction efficiency may not be sufficiently obtained.

Meanwhile, the shape of the raised portion 22 is not limited to the example shown in FIGS. 2 and 3, and any shape may be used insofar as it is formed as a surface nonparallel to the C-plane. For example, the shape may be such that the planar shape of the basal portion is approximately polygonal, the external contour thereof becomes gradually smaller in an upward direction, and the lateral side 12 is outwardly curved. In addition, the shape may also be an approximately conical shape or an approximately polygonal pyramid shape of which the external contour of the lateral side is formed as an inclined plane becoming gradually smaller in an upward direction. In addition, the shape may also be such that the inclination angle of the lateral side is changed stepwise at two levels.

In addition, the planar arrangement of the raised portions 22 is also not limited to the example shown in FIGS. 2 and 3, and the raised portions may be arranged at regular intervals, or may not be arranged at regular intervals. In addition, the planar arrangement of the raised portions 22 may be in a quadrilateral, triangular, or random form.

Meanwhile, in the embodiment, the raised portion 22 provided on the substrate 2 can be formed by etching the substrate 2 through a manufacturing method of which the details are described later, but the formation is not limited thereto. For example, the raised portion may be formed by depositing a different material which forms the raised portion on the substrate. It is possible to use various types of method such as, for example, a sputtering method, a vapor-deposition method, and a CVD method as methods of depositing a different material which forms the raised portion on the substrate. In addition, as a material forming the raised portion, a material having a refractive index, which is almost the same as that of a material of the substrate, is preferably used, and when the substrate is a sapphire substrate, for example, $Al_2O_3$, SiN, $SiO_2$ and the like can be used.

Shape of the Substrate: End Surface of the Substrate

The light-emitting device 1 of the embodiment is configured such that the end surface 2a of the substrate 2 is formed as a rough surface.

Figure 10:
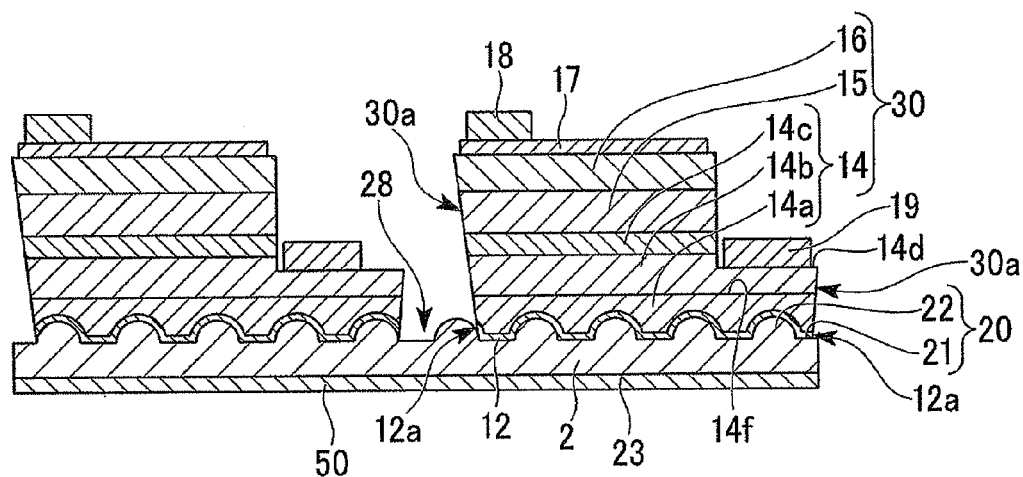
FIG. 10 is a diagram schematically explaining an example of the method of manufacturing the group-III nitride semiconductor light-emitting device according to the invention, and a cross-sectional view illustrating a temporary fixing step.

In the embodiment, a method of forming the end surface 2a of the substrate 2 as a rough surface is described in detail in the description of a manufacturing method mentioned later. Incidentally, as shown in FIG. 10, when a semiconductor wafer in which the buffer layer 12, the semiconductor layer 30 and the like are laminated on the substrate 2 is divided into individual light-emitting device chips, first, a protective film 13 and the semiconductor layer 30 (and the buffer layer 12) are removed along a scribing line 28 for dividing the substrate 2 by irradiating the protective film 13 with a laser, and the main surface 20 of the substrate 2, that is, the portion of the scribing line 28 is exposed. After processing marks 25 are provided to the inside of the substrate 2 by irradiation with a laser along the scribing line 28, the above-mentioned semiconductor wafer is broken off by causing a fissure in the substrate 2 using the starting point as the foregoing processing marks 25 by mechanically applying stress to the above-mentioned semiconductor wafer, and is divided into the light-emitting devices 1 which are in the state of individual chips.

At this time, although detailed illustration is omitted, there exist, in the end surface 2a of the substrate 2, a region in which periodic or aperiodic marks where at least a portion of the processing marks 25 caused by laser machining remains are formed, and a region in which the fissure marks generated when the above-mentioned semiconductor wafer is broken off along the processing marks 25 remain irregularly, which leads to an irregular rough surface as a whole.

As seen from the above, since a surface area of the end surface 2a increases due to the end surface 2a of the substrate 2 being formed as a rough surface, light incident on the substrate 2 can be efficiently emitted to the outside, resulting in improvement in the light extraction efficiency of the light-emitting device 1.

As stated above, the light-emitting device 1 of the embodiment is configured such that it is formed as a one-surface emission type (see FIG. 1) light-emitting device in which each electrode is formed at the main surface side of the device, and typically, the lower surface (second main surface) 23 side of the substrate 2 is used in a state of being fixed to a place in which the light-emitting device is installed. In such a light-emitting device, emitted light from the emission layer 15 mentioned later is emitted from the main surface side or the lateral side of the semiconductor layer 30, and a lot of light emitted from the lower surface side of the semiconductor layer 30 is incident on the main surface 20 side of the substrate 2. The light incident on the substrate 2 is propagated in the substrate 2 and reaches the lower surface 23 side or the end surface 2a. However, since the lower surface 23 is fixed to an installation place of the light-emitting device, the light incident on the substrate 2 is reflected and emitted from the main surface 20 toward the semiconductor layer 30, or, is emitted from the end surface 2a toward the outside of the light-emitting device 1.

Here, the light to be emitted so as to return from the substrate 2 toward the semiconductor layer 30 is efficiently emitted from the substrate 2 by the action of the raised portions 22 provided on the main surface 20 of the substrate 2 as mentioned above, and is propagated through the semiconductor layer 30 or the translucent positive electrode 17 and the like and then emitted to the outside of the light-emitting device 1.

The light directed to the end surface 2a side in the inside of the substrate 2 is emitted from the end surface 2a to the outside thereof. At this time, since the end surface 2a is formed as a rough surface mentioned above and is in a state in which there is an increased surface area compared with that of a typical flat surface, the light propagated in the substrate 2 is efficiently emitted to the outside. Thereby, the light extraction efficiency from the inside of the substrate 2 is improved, and consequently, the light extraction efficiency of the laminated semiconductor 10 (light-emitting device 1) can be raised, thereby allowing the emission output to be improved.

Thickness of the Substrate

In the embodiment, the thickness of the substrate 2 is preferably equal to or more than 100 μm. When the thickness of the substrate 2 has the above-mentioned dimensions, the light emitted from the semiconductor layer 30 mentioned later toward the substrate 2 side can be efficiently reflected toward the semiconductor layer 30, and high light extraction characteristics from the above-mentioned end surface 2a formed to have a rough surface can be secured with respect to the light incident on the substrate 2. When the thickness of the substrate 2 is less than 100 μm, it is difficult to obtain the above-mentioned effect sufficiently. In addition, when the substrate 22 is excessively thick, it is difficult to divide the substrate due to a rise in the mechanical strength of the substrate. Consequently, from the point of view of industrial productivity, the thickness of the substrate 2 is preferably set to be equal to or less than, for example, 300 μm.

Buffer Layer

The buffer layer 12 is laminated on the substrate 2 in a composition of $Al_XGa_{1-X}N$ ($1 \geq X \geq 0$), and for example, can be formed by a reactive sputtering method of activating a gas including group-V elements and a metallic material by plasma and reacting them with each other. There is an effect that orientation is easily obtained in a film formed by a method in which a metallic raw material turned into a plasma state is used, as in the embodiment.

The buffer layer 12 has a function for mitigating the difference of lattice constants between the substrate 2 and the underlying layer 14a and facilitating the formation of a single-crystal layer in which C-axis orientation on the C-plane of the substrate 2 is performed. Therefore, when a single-crystal underlying layer is laminated on the buffer layer 12, the underlying layer 14a which has superior crystallization can be formed. Meanwhile, in the embodiment, while it is most preferable to form the buffer layer 12 between the substrate 2 and the underlying layer 14a, the configuration in which the buffer layer is omitted is also possible.

Composition

In the embodiment, the buffer layer 12 is preferably made of the above-mentioned composition of $Al_XGa_{1-X}N$ ($1 \geq X \geq 0$), and is more preferably made of AlN. In general, the buffer layer to be laminated on the substrate is preferably made of a composition containing Al, and any materials can be used in the buffer layer insofar as it is a group-III nitride compound represented by a general expression of $Al_XGa_{1-X}N$ ($1 \geq X \geq 0$). Further, the buffer layer can be made of a composition containing As or P as group-V elements. Particularly when the buffer layer is made of a composition containing Al, it is preferably made of GaAlN. In this case, a composition of Al is preferably equal to or more than 50%. In addition, the buffer layer 12 is most preferably made of AlN.

In addition, as a material forming the buffer layer 12, while a material having a crystal structure the same as that of a group-III nitride semiconductor may be used, a material of which the length of a lattice is close to that of a group-III nitride semiconductor forming the underlying layer mentioned later is preferable, and a nitride of group-IIIa elements of the periodical table is particularly suitable.

Crystal Structure

A crystal of a group-III nitride forming the buffer layer has a hexagonal crystal structure, and can be formed as a single-crystal film by controlling film formation conditions. In addition, the crystal of a group-III nitride can also be formed as a columnar crystal (polycrystal) which is made of a texture based on a hexagonal column by controlling the above-mentioned film formation conditions. In the meantime, the term "columnar crystal" described herein refers to a crystal in which crystal grain boundaries are formed between adjacent crystal grains and separated from each other, and the boundaries themselves are columnar as a vertical sectional shape.

The buffer layer 12 is preferably a single-crystal structure from the viewpoint of a buffer function. As previously stated, the crystal of a group-III nitride has a hexagonal crystal, and forms a texture based on a hexagonal column. In the crystal of a group-III nitride, a crystal grown not only in an upper direction but also in an in-plane direction can be formed by controlling the film formation conditions and the like. When the buffer layer 12 having such a single-crystal structure is formed on the substrate 2, the buffer function of the buffer layer 12 works effectively, and thus the layer of a group-III nitride semiconductor formed thereon becomes a crystal film having good orientation and crystallization.

Film Thickness

The film thickness of the buffer layer 12 is preferably in the range of 10 to 500 nm. By setting the film thickness of the buffer layer 12 to this range, the crystal film has good orientation, and when each layer made of a group-III nitride semiconductor is formed on the buffer layer 12, the buffer layer 12 effectively functioning as a coating layer is obtained. When the film thickness of the buffer layer 12 is less than 10 nm, there may be a case where a sufficient function as the above-mentioned coating layer is not obtained, and the buffer action for mitigating a difference of the lattice constants between the substrate 2 and the underlying layer 14a is not sufficiently obtained. In addition, when the buffer layer 12 is formed with a film thickness exceeding 500 nm, there may be a concern that the film formation processing time becomes longer in spite of there being no change in the functioning as the buffer action or the coating layer, and productivity is lowered. In addition, the film thickness of the buffer layer 12 is more preferably in the range of 20 to 100 nm.

Coating Factor

The buffer layer 12 needs to cover at least 60% or more of the main surface 20 of the substrate 2, preferably 80% or more, and is more preferably formed so as to cover 90% or more from the viewpoint of a function for coating the substrate 2. In addition, the buffer layer 12 is most preferably formed so as to cover 100% of the main surface 20, that is, the upper portion of the main surface 20 with no interval. When the buffer layer 12 has a smaller region which covers the main surface 20, the buffer layer does not function as a coating layer due to the widely exposed substrate 2, there may be a concern that reaction occurs between the semiconductor raw material from which the group-III nitride semiconductor crystal is grown and the substrate according to the material used in the substrate, and flatness of the underlying layer 14a formed on the buffer layer 12 is deteriorated.

Semiconductor Layer

As shown in FIG. 4, the laminated semiconductor 10 of the embodiment is configured such that the underlying layer 14a made of a group-III nitride semiconductor is formed on the buffer layer 12 mentioned above. In addition, the semiconductor layer 30 is formed by further sequentially laminating the n-type contact layer 14b, an n-type cladding layer 14c, the emission layer 15 and the p-type semiconductor layer 16, which are made of a group-III nitride semiconductor, on the underlying layer 14a.

As group-III nitride semiconductors, there are known a large number of gallium nitride-based compound semiconductors represented by, for example, a general expression of $Al_X Ga_Y In_Z N_{1-A} M_A$ ($0 \leq X \leq 1$, $0 \leq Y \leq 1$, $0 \leq Z \leq 1$, and $X+Y+Z=1$. The symbol M represents group-V elements other than nitrogen (N), where $0 \leq A < 1$.). In the invention, there can be used, without limitation, gallium nitride-based compound semiconductors represented by a general expression of $Al_X Ga_Y In_Z N_{1-A} M_A$ ($0 \leq X \leq 1$, $0 \leq Y \leq 1$, $0 \leq Z \leq 1$ and $X+Y+Z=1$, the symbol M represents group-V elements except nitrogen (N), where $0 \leq A < 1$) including these known gallium nitride-based compound semiconductors.

In addition, the gallium nitride-based compound semiconductors can contain the group-III elements other than Al, Ga and In, and can contain, as necessary, elements such as Ge, Si, Mg, Ca, Zn, Be, P and As. Further, there may be a case where impurities are inevitably included depending on the film formation conditions and the like, and a small amount of impurities contained in a raw material and a reaction tube material are included without being limited to intentionally-added elements.

Herein, in the light-emitting device 1 as exemplified in FIG. 1, the lateral side 30a of the semiconductor layer 30 and the lateral side 12a of the buffer layer 12 are formed in a reversely-inclined plane shape which is reversely-inclined from the substrate 2 toward the upper portion thereof. As seen from the above, when the lateral side of the semiconductor layer (and buffer layer) is formed in a reversely-inclined plane shape, an area of the lateral side 30a (and the lateral side 12a of the buffer layer 12) of the semiconductor layer 30 increases, thereby allowing the light extraction efficiency from the semiconductor layer and the buffer layer to be improved.

In addition, the shape of the semiconductor layer included in the light-emitting device is not limited to the shape exemplified in FIG. 1, and for example, the lateral side of the semiconductor layer may also be formed as a shape vertically extended from the substrate toward the upper side thereof.

n-Type Semiconductor Layer

The n-type semiconductor layer 14 of the embodiment is formed on the buffer layer 12, and is constituted by the underlying layer 14a, the n-type contact layer 14b and the n-type cladding layer 14c. Meanwhile, the underlying layer 14a can also serve as the n-type contact layer. In addition, the n-type contact layer 14b can also serve as the n-type cladding layer 14c.

Underlying Layer

The underlying layer 14a of the embodiment is made of a group-III nitride semiconductor as mentioned above, and is laminated and formed on the buffer layer 12 by the MOCVD method known hitherto.

A material of the underlying layer 14a does not necessarily need to be the same as that of the buffer layer 12 formed on the substrate 2, and a different material may be used. For example, while $Al_X Ga_Y In_Z N$ ($0 \leq x \leq 1$, $0 \leq y \leq 1$, $0 \leq z \leq 1$, $x+y+z=1$) can also be used in the underlying layer 14a, it is more preferable to use an $Al_y Ga_{1-y} N$ layer ($0 \leq y \leq 1$, preferably $0 \leq y \leq 0.5$, and more preferably $0 \leq y \leq 0.1$) from the viewpoint that the underlying layer 14a having good crystallization can be formed. In addition, as a material used in the underlying layer 14a, it is preferable to use a group-III nitride compound including Ga, that is, a GaN-based compound semiconductor, and particularly, AlGaN or GaN can be suitably used.

Meanwhile, when the buffer layer 12 is formed as an aggregate of the columnar crystal made of AlN, it is necessary to loop dislocation by migration so that the underlying layer 14a does not take over the crystallization of the buffer layer 12 as it is. However, such a material also includes the above-mentioned GaN-based compound semiconductor including Ga, and particularly, AlGaN or GaN is suitable.

While the underlying layer 14a may be configured to be doped with the n-type impurities within a range of $1\times10^{17}$ to $1\times10^{19}/cm^3$ as necessary, the underlying layer can be configured to be undoped ($<1\times10^{17}/cm^3$), and the undoped configuration is preferable from the viewpoint that crystallization can be maintained.

When the substrate 2 is conductive, the electrodes can be formed above and below the light-emitting device by doping the underlying layer 14a with dopants in order to have conductive properties. On the other hand, when an insulating material is used in the substrate 2, a chip structure is taken in which each of the electrodes of a positive electrode and a negative electrode is provided on the same surface of the light-emitting device, and thus the underlying layer 14a is preferably formed as a crystal which is not doped for the reason of good crystallization. Though the n-type impurities are not particularly limited, for example, they include Si, Ge and Sn or the like, and preferably include Si and Ge.

The film thickness of the underlying layer 14a is preferably set to a range of 0.1 to 8 µm from the viewpoint that the underlying layer having good crystallization is obtained, and is more preferably set to a range of 0.1 to 2 µm from the viewpoint that the processing time required for the film formation can be shortened and productivity is improved.

In addition, the maximum thickness H of the underlying layer 14a shown in FIG. 4 is preferably set to be equal to or more than two times the height h of the raised portion 22 of the substrate 2 for the reason that the underlying layer 14a having a flat surface 14f is obtained. When the maximum thickness H of the underlying layer 14a is smaller than twice the height h of the raised portion 22, there may be a concern that the flatness of the surface 14f of the underlying layer 14a grown so as to cover the raised portions 22 becomes insufficient, and that the crystallization of each of the layers, laminated on the underlying layer 14f, that forms the semiconductor layer 30 is lowered.

n-Type Contact Layer

The n-type contact layer 14b of the embodiment is a layer for providing the negative electrode, is made of a group-III nitride semiconductor, and can be laminated and formed on the underlying layer 14a by the MOCVD method or the reactive sputtering method.

The n-type contact layer 14b is preferably formed of an $Al_xGa_{1-x}N$ layer ($0\leq x\leq1$, preferably $0\leq x\leq0.5$, and more preferably $0\leq x\leq0.1$), similarly to the underlying layer 14a mentioned above. In addition, the n-type contact layer is preferably doped with the n-type impurities, and it preferably contains the n-type impurities at a concentration of $1\times10^{17}$ to $1\times10^{19}/cm^3$, preferably $1\times10^{18}$ to $1\times10^{19}/cm^3$, in terms of maintenance of a good ohmic contact with the negative electrode, suppression of crack generation, and maintenance of good crystallization. Though the n-type impurities are not particularly limited, for example, they include Si, Ge and Sn or the like, and preferably include Si and Ge. In addition, the growth temperature of the n-type contact layer 14b can be set to a temperature similar to the growth temperature of the underlying layer 14a. In addition, the gallium nitride-based compound semiconductor forming the n-type contact layer 14b is preferably the same composition as that of the underlying layer 14a.

The film thickness of the n-type contact layer 14b is preferably in the range of 0.5 to 5 µm, and is more preferably set to the range of 1 to 3 µm. Insofar as the film thickness of the n-type contact layer 14b is in the above-mentioned range, good crystallization is maintained.

Further, in the embodiment, it is preferable to set the total film thickness of the underlying layer 14a and the n-type contact layer 14b mentioned above to the range of 0.1 to 20 µm, preferably the range of 0.5 to 15 µm, and more preferably the range of 1 to 12 µm. Insofar as the film thickness is in this range, good crystallization of each layer is maintained.

n-Type Cladding Layer

The n-type cladding layer 14c is preferably provided between the n-type contact layer 14b mentioned above and the emission layer 15 of which the details are described later. The n-type cladding layer 14c is a layer for performing implantation of carriers and confinement of the carriers into the emission layer 15. It is possible to improve deterioration of the flatness generated in the uppermost surface of the n-type contact layer 14b by providing the n-type cladding layer 14c. The n-type cladding layer 14c can be formed of AlGaN, GaN, GaInN and the like by using the MOCVD method and the like. In addition, the n-type cladding layer may be formed to have a superlattice structure with a heterojunction or multiple laminations of these structures. When the n-type cladding layer is formed of GaInN, it goes without saying that it is preferable to make a band gap of the n-type cladding layer greater than a band gap of GaInN of the emission layer 15.

Though the film thickness of the n-type cladding layer 14c is not particularly limited, it is preferably in the range of 5 to 500 nm, and more preferably in the range of 5 to 100 nm.

In addition, the n-type doping concentration of the n-type cladding layer 14c is preferably in the range of $1\times10^{17}$ to $1\times10^{20}/cm^3$, and more preferably in the range of $1\times10^{18}$ to $1\times10^{19}/cm^3$. When the doping concentration is in this range, it is preferable in terms of maintenance of good crystallization and reduction in the operating voltage of the light-emitting device.

In the meantime, when the n-type cladding layer 14c is formed of a layer including a superlattice structure, while the detailed illustration is omitted, the n-type cladding layer may include a structure in which an n-side first layer made of a group-III nitride semiconductor having a film thickness of equal to or less than 100 angstroms, and an n-side second layer made of a group-III nitride semiconductor having a different composition from that of the n-side first layer and having a film thickness of equal to or less than 100 angstroms are laminated. In addition, the n-type cladding layer 14c may include a structure in which the n-side first layers and the n-side second layers are alternately repeatedly laminated. In addition, preferably, either of the n-side first layer or the n-side second layer may be in contact with the emission layer 15.

The n-side first layer and the n-side second layer mentioned above can be formed of, for example, an AlGaN-based composition containing Al (which may be simply referred to as AlGaN), a GaInN-based composition containing In (which may be simply referred to as GaInN), or a GaN composition. In addition, the n-side first layer and the n-side second layer may have an alternate structure of GaInN/GaN, an alternate structure of AlGaN/GaN, an alternate structure of GaInN/AlGaN, an alternate structure of GaInN/GaInN with a different composition (the term "different composition" in the invention indicates that the composition ratio of each element is different and will be hereinafter used with the same meaning), and an alternate structure of AlGaN/AlGaN with a different composition. In the invention, the n-side first layer and the n-side second layer preferably have an alternate structure of GaInN/GaN or GaInN/GaInN with a different composition.

The thicknesses of the above-mentioned superlattice layers of the n-side first layer and the n-side second layer are preferably equal to or less than 60 angstroms, respectively, more preferably equal to or less than 40 angstroms, respectively, and most preferably in the range of 10 angstroms to 40 angstroms, respectively. If the thicknesses of the n-side first layer and the n-side second layer forming the superlattice layer exceed 100 angstroms, crystal defects will be easily contained therein, which leads to an undesirable result.

The above-mentioned n-side first layer and the n-side second layer may have a doped structure, respectively, and may have a combination of doped structure/undoped structure. As to impurities to be doped, any impurities known in the related art for the above-mentioned material compositions can be applied without limitation. For example, when an alternate structure of GaInN/GaN or an alternate structure of GaInN/GaInN having a different composition is used as the n-type cladding layer, Si is suitable as an impurity. In addition, the n-side superlattice multilayer film as mentioned above may have the same compositions as those of GaInN, AlGaN, or GaN, and may be formed while appropriately changing the ON/OFF state of doping.

Emission Layer

The emission layer 15 is a layer laminated on the n-type semiconductor layer 14. Each of the structures of a single quantum well structure or a multiple quantum well structure and the like can be adopted thereto, and the emission layer can be formed using the MOCVD method and the like known in the related art. The p-type semiconductor layer 16 is laminated on the emission layer 15.

As shown in FIG. 4, the emission layer 15 of the embodiment is configured such that barrier layers 15a made of a gallium nitride-based compound semiconductor, and well layers 15b made of a gallium nitride-based compound semiconductor containing indium are alternately repeatedly laminated, and are, in the example shown, laminated in the order that the barrier layers 15a are disposed at the n-type semiconductor layer 14 side and the p-type semiconductor layer 16 side.

As to the barrier layer 15a, it is possible to suitably use, for example, a gallium nitride-based compound semiconductor such as $Al_cGa_{1-c}N$ ($0 \le c < 0.3$) having a band gap energy higher than that of the well layer 15b made of a gallium nitride-based compound semiconductor containing indium.

In addition, as a gallium nitride-based compound semiconductor containing indium, for example, a gallium indium nitride such as $Ga_{1-s}In_sN$ ($0 < s < 0.4$) can be used in the well layer 15b. The thickness of the well layer 15b can be set to a degree where the quantum effect can be obtained, for example, 1 to 10 nm, and is preferably 2 to 6 nm, in terms of the emission output.

In addition, the barrier layer 15a and the well layer 15b of the embodiment may be or may not be doped with an impurity, according to the design.

In addition, though the thickness of the whole emission layer 15 is not particularly limited, it is preferably in the range of, for example, 1 to 500 nm, and more preferably around 100 nm. When the film thickness is in the above-mentioned range, there is a contribution to the improvement in the emission output.

p-Type Semiconductor Layer

The p-type semiconductor layer 16 is typically constituted by a p-type cladding layer 16a and a p-type contact layer 16b, and is formed using the MOCVD method or a reactive sputtering method. In addition, the p-type contact layer can also serve as the p-type cladding layer.

The p-type semiconductor layer 16 of the embodiment contains added p-type impurities for controlling conductivity with p-type. As a p-type impurity, though not particularly limited, Mg is preferably used, and Zn may be used similarly.

In addition, though the whole thickness of the p-type semiconductor layer 16 is not particularly limited, it is preferably in the range of 0.05 to 1 µm.

p-Type Cladding Layer

The p-type cladding layer 16a is a layer for performing confinement of carriers and implantation of carriers into the emission layer 15. The composition of the p-type cladding layer 16a is a composition having a band gap energy higher than that of the emission layer 15. Though the composition is not particularly limited insofar as confinement of carriers into the emission layer 15 is possible, it preferably includes $Al_dGa_{1-d}N$ ($0 < d \le 0.4$, preferably $0.1 \le d \le 0.3$). When the p-type cladding layer 16a is made of such AlGaN, this is preferable from the viewpoint of confinement of carriers into the emission layer 15.

In addition, though the thickness of the p-type cladding layer 16a is not particularly limited, it is preferably 1 to 400 nm, and more preferably 5 to 100 nm.

The p-type dopant concentration obtained by adding a p-type impurity to the p-type cladding layer 16a is preferably in the range of $1 \times 10^{18}$ to $5 \times 10^{21}/cm^3$, and more preferably in the range of $1 \times 10^{19}$ to $5 \times 10^{20}/cm^3$. When the p-type dopant concentration is in the above-mentioned range, a good p-type crystal is obtained without lowering crystallization.

In addition, the p-type cladding layer 16a of the embodiment can be formed to have a superlattice structure with multiple laminations, similarly to the n-type cladding layer 14c mentioned above. When the p-type cladding layer 16a is formed of a layer including a superlattice structure, while the detailed illustration is omitted, the p-type cladding layer may include a structure in which a p-side first layer made of a group-III nitride semiconductor having a film thickness of equal to or less than 100 angstroms, and a p-side second layer made of a group-III nitride semiconductor having a composition different from the p-side first layer and a film thickness of equal to or less than 100 angstroms are laminated. In addition, the p-type cladding layer may include a structure in which the p-side first layer and the p-side second layer are alternately repeatedly laminated.

The p-side first layer and the p-side second layer as mentioned above may have different compositions, respectively, for example, any compositions of AlGaN, GaInN or GaN, and may have an alternate structure of GaInN/GaN, an alternate structure of AlGaN/GaN, or an alternate structure of GaInN/AlGaN. In the invention, the p-side first layer and the p-side second layer may preferably have an alternate structure of AlGaN/AlGaN or AlGaN/GaN.

The superlattice layers of the p-side first layer and the p-side second layer mentioned above are preferably equal to or less than 60 angstroms, respectively, and more preferably equal to or less than 40 angstroms, respectively, and most preferably in the range of 10 angstroms to 40 angstroms, respectively. When the thicknesses of the p-side first layer and the p-side second layer forming the superlattice layer exceed 100 angstroms, these layers include many crystal defects, which is not preferable.

The p-side first layer and the p-side second layer mentioned above may have a doped structure, respectively, and may have a combination of doped structure/undoped structure. As to impurities to be doped, any impurities known in the related art for the above-mentioned material compositions can be applied without limitation. For example, when an alternate structure of AlGaN/GaN or an alternate structure of AlGaN/AlGaN having a different composition is used as the p-type cladding layer, Mg is suitable as an impurity. In addition, the above mentioned p-side superlattice multilayer film may have the same composition as represented by GaInN, AlGaN, or GaN, and may be formed while appropriately changing the ON/OFF state of doping.

p-Type Contact Layer

The p-type contact layer 16b is a layer for providing the positive electrode. The p-type contact layer 16b is a gallium nitride-based compound semiconductor layer including at least $Al_eGa_{1-e}N$ ($0 \le e < 0.5$, preferably $0 \le e \le 0.2$, and more preferably $0 \le e \le 0.1$). When the Al composition is in the above-mentioned range, this is preferable in terms of maintenance of good crystallization and ohmic contact with a p-ohmic electrode (see the translucent positive electrode 17 described later).

Though the thickness of the p-type contact layer 16b is not particularly limited, it is preferably in the range of 10 to 500 nm, and more preferably in the range of 50 to 200 nm. When the film thickness is in this range, this is preferable in terms of the emission output.

In addition, when the p-type dopant concentration obtained by adding a p-type impurity to the p-type contact layer 16b is preferably set to the range of $1 \times 10^{18}$ to $1 \times 10^{21}/cm^3$, in terms of maintenance of the good ohmic contact, prevention of generation of cracks, and maintenance of the good crystallization, and more preferably in the range of $5 \times 10^{19}$ to $5 \times 10^{20}/cm^3$.

Translucent Positive Electrode

The translucent positive electrode 17 is a translucent electrode formed on the p-type semiconductor layer 16 (p-type contact layer 16b) of the laminated semiconductor 10 mentioned above.

A material of the translucent positive electrode 17 is not particularly limited, and materials such as ITO ($In_2O_3$—$SnO_2$), AZO (ZnO—$Al_2O_3$), IZO ($In_2O_3$—ZnO), GZO (ZnO—$Ga_2O_3$) can be provided by commonly used means widely known in the technical field. In addition, as to its structure, any structures including the structure known in the related art can be used without limitation.

In addition, the translucent positive electrode 17 may be formed so as to cover the nearly the whole surface of the p-type semiconductor layer 16, and may be formed in a lattice shape or in a tree shape with opening gaps.

Positive Electrode Bonding Pad and Negative Electrode Bonding Pad

The positive electrode bonding pad 18 is an electrode formed on a portion of the above-mentioned translucent positive electrode 17, and is provided for the purpose of the electrical connection with a circuit substrate or a lead frame and the like.

As to materials of the positive electrode bonding pad 18, various types of structures using Au, Al, Ni, Cu and the like are widely known, and these widely known materials and structures can be used without limitation.

The thickness of the positive electrode bonding pad 18 is preferably in the range of 100 to 1000 nm. In addition, since the thick bonding pad has higher bondability from the viewpoint of the characteristics of the bonding pad, the thickness of the positive electrode bonding pad 18 is more preferably set to equal to or more than 300 nm. Further, the thickness is preferably set to be equal to or less than 500 nm from the viewpoint of manufacturing cost.

The negative electrode bonding pad 19 is formed to be in contact with the n-type contact layer 14b of the n-type semiconductor layer 14 in the semiconductor layer in which the n-type semiconductor layer 14, the emission layer 15 and the p-type semiconductor layer 16 are sequentially laminated on the substrate 2. For this reason, when the negative electrode bonding pad 19 is provided, the exposed region 14d of the n-type contact layer 14b is formed by removing a portion of the p-type semiconductor layer 16, the emission layer 15 and the n-type semiconductor layer 14, and the negative electrode bonding pad 19 is formed thereon.

As to a material of the negative electrode bonding pad 19, negative electrodes having various types of compositions and structures are widely known. These widely known negative electrodes can be used without limitation, and can be provided by commonly used means widely known in the technical field.

According to the group-III nitride semiconductor device 1 of the embodiment as described above, it is possible to provide the light-emitting device 1 in which the substrate 2 includes the main surface 20 constituted by the flat surface 21 of the C-plane and a plurality of raised portions 22 formed on the C-plane, and the semiconductor layer 30 is formed so as to cover the main surface 20 by epitaxially growing a group-III nitride semiconductor on the main surface 20, so that confinement of light into the inside of the light-emitting device is reduced by diffused reflection of light in the interface, and confinement of light into the inside of the light-emitting device is reduced by forming the lateral side 30a of the semiconductor layer 30 in a reversely-inclined plane shape which is reversely-inclined from the main surface 20 toward the side (upper portion) on which the semiconductor layer 30 is formed, and further, the end surface 2a of the substrate 2 of the divided light-emitting device is formed to have a rough surface, so that the light-emitting device 1 has a higher emission output than that of the related art due to the special effect that light propagating in the substrate 2 is efficiently emitted to the outside.

Therefore, the group-III nitride semiconductor light-emitting device according to the invention has a high emission output and electrical characteristic.

Method of Manufacturing of the Group-III Nitride Semiconductor Light-Emitting Device A method of manufacturing a group-III nitride semiconductor device of the embodiment is a method of forming the semiconductor layer 30 by sequentially laminating the n-type semiconductor layer 14, the emission layer 15 and the p-type semiconductor layer 16, which are made of a group-III nitride compound, on the substrate 2, in which the substrate 2 having the main surface 20 constituted by the flat surface 21 of the C-plane and a plurality of raised portions 22 formed on the C-plane is prepared, the method including: an epitaxial step of forming the semiconductor layer 30 so as to cover the main surface (first main surface) 20 by epitaxially growing a group-III nitride semiconductor on the main surface 20, a masking step (protective film forming step) of forming the protective film 13 on the semiconductor layer 30, a semiconductor layer removal step of removing the protective film 13 and the semiconductor layer 30 and exposing the substrate 2 by laser irradiation from the side of the substrate 2 on which the semiconductor layer 30 and the protective film 13 are formed along the scribing line (cutting expectation line) 28 for dividing the substrate 2 into a plurality of chips, a grinding step of reducing the thickness of the substrate 2 by grinding the lower surface (second main surface) 23 of the substrate 2, a polishing step of polishing (lapping) the substrate 2 after the grinding step, a laser processing step of providing the processing marks 25 to the inside of the substrate 2 by laser irradiation along the scribing line 28, and a division step of dividing the substrate 2 into a plurality of chips (light-emitting device 1) along the processing marks 15 and the scribing line 28 while forming the divided surface (see the end surface 2a shown in FIG. 1) of the substrate 2 to have a rough surface.

Further, in the embodiment, there will be described an example including, in the manufacturing method including each of the above-mentioned steps, an etching step between the semiconductor layer removal step and the grinding step, a protective film removal step between the etching step and the grinding step, an electrode forming step between the epitaxial step and the masking step, a temporary fixing step of attaching the substrate 2 to a temporary fixing sheet 50 between the grinding step and the laser processing step, and a sheet peeling step of, after the division step, separating the plurality of light-emitting device chips (light-emitting devices 1) from one another by heating and expanding the temporary fixing sheet 50, and then detaching the light-emitting device chip from the temporary fixing sheet 50.

In the manufacturing method of the embodiment, when the laminated semiconductor 10 shown in FIG. 1 is formed by epitaxially growing the crystal of a group-III nitride semiconductor on the substrate 2, first, the buffer layer 12 is formed on the substrate 2 so as to cover the main surface 20, and then the underlying layer 14a included in the n-type semiconductor layer 14 is formed thereon. The group-III nitride semiconductor light-emitting device having an LED structure (semiconductor layer 30) is manufactured by further sequentially laminating the n-type contact layer 14b and the n-type cladding layer 14c included in the n-type semiconductor layer 14, the emission layer 15 and the p-type semiconductor layer 16 on the underlying layer 14a.

Preparation of the Substrate

FIG. 3 is a diagram for explaining an example of a process of manufacturing the laminated structure schematically shown in FIG. 2, and a perspective view showing the substrate 2 to be prepared in the manufacturing method of the embodiment. This substrate 2 includes the main surface (first main surface) 20 constituted by the flat surface 21 of the C-plane and a plurality of raised portions 22 formed on the C-plane. Hereinafter, an example for a method of processing the substrate 2 as shown in FIG. 3 will be described.

The substrate 2 is obtained by forming a plurality of raised portions 22 having surfaces nonparallel to the C-plane on, for example, the (0001) C-plane of a sapphire substrate to form the main surface 20 constituted by the flat surface 21 of the C-plane and the raised portions 22. Such a step of performing substrate processing can be executed by a method including, for example, a patterning step of forming a mask which defines planar arrangement of the raised portions 22 on the substrate 2, and an etching step of etching the substrate 2 using the mask formed by the patterning step to form the raised portions 22.

In the embodiment, as to a material of the substrate on which a plurality of raised portions 22 is formed, a sapphire single-crystal wafer having the (0001) C-plane as the surface is used. Here, the substrate having the (0001) C-plane as the surface also includes a substrate to which an off-angle is given in a range of ±3° from the (0001) direction with respect to a face orientation thereof. In addition, the term "surface non-parallel to the C-plane" means a surface which does not have a surface parallel to the (0001) C-plane in a range of ±3°.

The patterning step can be performed by a general photolithography method. The basal portion width $d_1$ of the basal portion 22a of the raised portion 22 to be formed in the substrate processing step is preferably equal to or less than 5 μm. Therefore, in order to uniformly pattern the whole surface of the substrate 2, a stepper exposure method is preferably used among the photolithography methods. However, when a pattern of the raised portions 22 having the basal portion width $d_1$ of equal to or less than 1 μm is formed, an expensive stepper apparatus is required and thus costs are increased. For this reason, when a pattern of the raised portion width $d_1$ having a width of equal to or less than 1 μm is formed, a laser exposure method or a nano-imprinting method for use in the field of optical discs is preferably used.

A method of etching the substrate in the etching step includes a dry etching method or a wet etching method. However, when the wet etching method is used as an etching method, it is difficult to form the raised portions 22 having the surfaces 22c nonparallel to the C-plane because the crystal plane of the substrate 2 is exposed. Therefore, the dry etching method is preferably used.

The raised portions 22 having the surfaces 22c nonparallel to the C-plane can be formed by dry-etching the substrate 2 until the mask formed in the patterning step mentioned above is eliminated. Specifically, for example, a resist is formed on the substrate 2 and patterning is made in a predetermined shape, and then the lateral side of the resist is formed in a tapered shape by post-baking by performing heat treatment at 110° C. for thirty minutes using an oven and the like. Next, the raised portions 22 can be formed by performing dry etching until the resist is eliminated in a predetermined condition for promoting transverse etching.

In addition, the raised portions 22 having the surfaces 22c nonparallel to the C-plane can also be formed by a method of dry-etching the substrate using the mask, and then peeling off the mask and dry-etching the substrate 2 once again. Specifically, for example, a resist is formed on the substrate 2 and patterning is made in a predetermined shape, and then the lateral side of the resist is formed in a tapered shape by post-baking by performing heat treatment at 110° C. for thirty minutes using an oven and the like. Next, dry etching is performed with predetermined conditions for promoting the transverse etching, and the dry etching is stopped before the resist is eliminated. Thereafter, the raised portions 22 can be formed by peeling off the resist and starting the dry etching again to perform etching at a predetermined amount. The raised portions 22 formed by such a method have excellent in-plane uniformity of the height dimensions.

In addition, when the wet etching method is used as an etching method, the raised portions 22 having the surfaces 22c nonparallel to the C-plane can be formed by a combination with the dry etching method.

For example, when the substrate 2 is made of a sapphire single crystal, wet etching can be performed by using a mixed acid and the like of phosphoric acid and sulfuric acid at a high temperature of 250° C. or higher.

As to a combination method of the wet etching method and the dry etching method, the raised portions 22 can be formed by, for example, by dry-etching the substrate 2 until the mask is eliminated, and then performing the wet etching of a predetermined amount using a high-temperature acid. By forming the raised portions 22 using such a method, the crystal plane is exposed to the inclined plane forming the lateral side of the raised portion 22, thereby allowing the angle of the inclined plane forming the lateral side of the raised portion 22 to be formed with good reproducibility. In addition, the good crystal plane can be exposed to the main surface 20 with good reproducibility.

In addition, as to the combination method of the wet etching method and the dry etching, besides the above-mentioned method, the raised portions 22 can also be formed by a method of forming a mask made of a material resistant to an acid such as SiO$_2$ and performing the wet etching, followed by peeling of the mask, and performing the dry etching in a predetermined condition for promoting the transverse etching. The raised portions 22 formed by such a method have excellent in-plane uniformity of the height dimensions. In addition, even when the raised portions 22 are formed using such a method, it is possible to form the angle of the inclined plane forming the lateral side of the raised portion 22 with good reproducibility.

Meanwhile, in the embodiment, although the methods of forming the raised portions have been described with an example in which the etching method is used, the invention is not limited to the above-mentioned methods. For example, there may be used a method of forming the raised portions by depositing a material forming the raised portions on the substrate. The method of depositing a material forming the raised portions on the substrate can be appropriately selected and adopted from, for example, a sputtering method, a vapor-deposition method, a CVD method and the like. In addition, as to the material forming the raised portions, it is preferable to use a material having almost the same refractive index as that of the substrate. For the substrate made of a sapphire, for example, Al$_2$O$_3$, SiN, SiO$_2$ and the like can be used.

Buffer Layer Forming Step

Next, in a buffer layer forming step, the buffer layer 12 as shown in FIG. 2 (see also FIGS. 1 and 4) is laminated on the main surface 20 of the substrate 2 prepared by the above-mentioned method.

Pretreatment of the Substrate

In the embodiment, after the substrate 2 is introduced into a chamber of a sputtering apparatus, and before the buffer layer 12 is formed, pretreatment is preferably performed using a method such as reverse sputtering through plasma treatment. Specifically, the surface can be cleaned up by exposing the substrate 2 to plasma of Ar or N$_2$. For example, organic materials or oxides attached to the surface of the substrate 2 can be removed by the reverse sputtering when causing plasma such as an Ar gas or an N$_2$ gas to act on the surface of the substrate 2. In this case, if a voltage is applied between the substrate 2 and the chamber, plasma particles will act efficiently on the substrate 2. By performing such pretreatment on the substrate 2, it is possible to form the buffer layer 12 on the whole surface of the substrate 2, and to enhance crystallization of the film made of a group-III nitride semiconductor formed thereon. In addition, before pretreatment through the reverse sputtering mentioned above is performed on the substrate 2, wet pretreatment is more preferably performed thereon.

In addition, the pretreatment on the substrate 2 is preferably performed by the plasma treatment which is performed in an atmosphere where an ion component such as N$^+$, (N$_2$)$^+$ and a radical component, such as an N radical and an N$_2$ radical, which has no charge are mixed.

Here, when contamination such as organic materials or oxides is removed from the surface of the substrate, for example, when only an ion component and the like are supplied to the substrate surface, there is a problem that the energy is so strong that the substrate surface is damaged, to thereby cause the quality of the crystal grown on the substrate to be lowered. In the embodiment, the pretreatment on the substrate 2 is performed by a method using the plasma treatment, as mentioned above, performed in an atmosphere where an ion component and an radical component are mixed, and reactive species having an appropriate energy are caused to act on the substrate 2, thereby allowing contamination and the like to be removed without damaging the surface of the substrate 2. As the mechanism by which such an effect is obtained, there may be considered a mechanism capable of reducing damage to the surface of the substrate 2 by using plasma having a small ratio of the ion component, and a mechanism capable of effectively removing contamination by causing plasma to act on the surface of the substrate 2, and the like.

Formation of the Buffer Layer

After the pretreatment is performed on the substrate 2, the buffer layer 12 made of a composition of Al$_X$Ga$_{1-X}$N (1≥X≥0) is formed on the substrate 2 by the reactive sputtering method. When the buffer layer 12 having a single-crystal structure is formed by the reactive sputtering method, the nitrogen raw material within the chamber of the sputtering apparatus and the ratio of the nitrogen flow to the inert gas flow are preferably set such that the nitrogen raw material accounts for 50% to 100%, and preferably 75%. In addition, when the buffer layer 12 having a columnar crystal (polycrystal) structure is formed, the nitrogen raw material within the chamber of the sputtering apparatus and the ratio of the nitrogen flow to the inert gas flow are preferably controlled such that the nitrogen raw material accounts for 1% to 50%, and preferably 25%.

The buffer layer 12 can be formed not only using the reactive sputtering method mentioned above, but also using, for example, the MOCVD method. However, since the raised portions 22 are formed on the main surface 20 of the substrate 2, there may be a concern that when the buffer layer is formed by the MOCVD method, turbulence is caused in the flow of the raw material gas on the main surface 20. For this reason, it is difficult to uniformly laminate the buffer layer 12 on the main surface 20 of the substrate 2 as in the embodiment by using the MOCVD method. On the other hand, for such an MOCVD method, the reactive sputtering method has an excellent straightness property of raw material particles, thereby allowing the buffer layer 12 to be uniformly laminated without influencing the shape of the main surface 20. Therefore, the buffer layer 12 is preferably formed using the reactive sputtering method.

Epitaxial Step

Next, an epitaxial step is performed in which after the above-mentioned buffer layer forming step, as shown in FIG. 2 (see also FIGS. 1 and 4), the single-crystal semiconductor layer 30 is epitaxially grown on the buffer layer 12 formed on the main surface 20 of the substrate 2, to form the semiconductor layer 30 so as to cover the main surface 20.

In the embodiment, first, as shown in FIG. 2, the underlying layer 14a included in the n-type semiconductor layer 14 on the buffer layer 12 formed on the substrate 2 is formed on the buffer layer 12 so as to cover the flat surface 21 and the raised portions 22 constituting the main surface 20 of the substrate 2, using the MOCVD method known in the related art. As shown in FIG. 4, the n-type contact layer 14b, the n-type cladding layer 14c, the emission layer 15 and the p-type semiconductor layer 16 are further sequentially laminated on the underlying layer 14a using the MOCVD method known in the related art, to form the semiconductor layer 30 constituted by each of these layers.

In the embodiment, methods of growing a gallium nitride-based compound semiconductor at time of forming the n-type semiconductor layer 14, the emission layer 15 and the p-type semiconductor layer 16 are not particularly limited, and it is possible to apply all methods known to allow growth of a nitride semiconductor, such as an MOCVD (Metalorganic Chemical Vapor Deposition) method, an HVPE (Hydride Vapor Phase Epitaxy) method, an MBE (Molecular Beam Epitaxy) method, or the like, in addition to the above-mentioned sputtering method. In the MOCVD method amongst these methods, hydrogen ($H_2$) or nitrogen ($N_2$) can be used as a carrier gas, trimethyl gallium (TMG) or triethylgallium (TEG) can be used as a Ga source which is a group-III raw material, trimethyl aluminum (TMA) or triethylaluminum (TEA) can be used as an Al source, trimethylindium (TMI) or triethylindium (TEI) can be used as an In source, and ammonia ($NH_3$), hydrazine ($N_2H_4$) and the like can be used as an N source which is a group-V raw material. In addition, as to an n-type dopant, monosilane ($SiH_4$) or disilane ($Si_2H_6$) can be used as an Si raw material, and an organic germanium compound such as germane gas ($GeH_4$), tetramethylgermanium ($(CH_3)_4Ge$), or tetraethylgermanium ($(C_2H_5)_4Ge$) can be used as a Ge raw material. In the MBE method, elemental germanium can also be used as a doping source. As to a p-type dopant, for example, bis(cyclopentadienyl)magnesium ($Cp_2Mg$) or bis(ethylcyclopentadienyl)magnesium ($EtCp_2Mg$) can be used as an Mg raw material.

The gallium nitride-based compound semiconductor as mentioned above can contain group-III elements other than Al, Ga and In, and can contain dopant elements such as Ge, Si, Mg, Ca, Zn, and Be, as necessary. Further, the gallium nitride-based compound semiconductor is not limited to intentionally-added elements, and may include impurities inevitably included depending on the film formation conditions, raw materials, and a small amount of impurities contained in the material of a reaction tube.

Formation of the n-Type Semiconductor Layer

In the manufacturing method of the embodiment, after the underlying layer 14a is first formed as the n-type semiconductor layer 14 by the MOCVD method, the n-type contact layer 14b is formed thereon by the reactive sputtering method, and then the n-type cladding layer 14c is further formed thereon using the MOCVD method known in the related art. In addition, the n-type contact layer 14b can also be formed by the MOCVD method.

Formation of the Underlying Layer

In the embodiment, the underlying layer 14a made of a group-III nitride semiconductor is first formed on the buffer layer 12 which is formed on the substrate 2 by each of the conditions and procedures mentioned above using the MOCVD method known in the related art.

In the embodiment, before the underlying layer 14a is formed, it is not especially necessary to perform the annealing treatment on the buffer layer 12. However, generally, when the film formation of a group-III nitride semiconductor is performed by gas-phase chemical film formation methods such as MOCVD, MBE and VPE, the film formation is processed through the elevated temperature process and the stabilization process of the temperature without the film formation. However, since a group-V raw material gas is often circulated within the chamber in these processes, there may be a case where the annealing effect occurs as a result. In addition, as to a carrier gas circulated on this occasion, a general gas can be used without any limitation, and hydrogen or nitrogen and the like widely used in a gas-phase chemical film formation method such as MOCVD may be used. However, when chemically relatively active hydrogen is used as a carrier gas, since there may be a possibility of deterioration in the crystallization or flatness of the crystal surface, it is preferable to shorten the processing time.

In the manufacturing method of the embodiment, the underlying layer 14a is formed using the MOCVD method. However, a method of laminating the underlying layer 14a is not particularly limited, and any method can be used without limitation insofar as it is a crystal growth method capable of generating dislocation looping. In particular, the MOCVD method, the MBE method, the VPE method and the like can generate migration, and thus these methods are suitable from the viewpoint that a film having good crystallization can be formed. Above all, the MOCVD method can be more suitably used, particularly, from the viewpoint that a film having good crystallization can be obtained.

The temperature of the substrate 2 at the time of forming the underlying layer 14a, that is, the growth temperature of the underlying layer 14a is preferably set to 800° C. or higher. This is because migration of atoms is easily generated by raising the temperature of the substrate 2 at the time of forming the underlying layer 14a, and dislocation looping proceeds without difficulty. The temperature is more preferably 900° C. or higher, and most preferably 1000° C. or higher. In addition, the temperature of the substrate 2 at the time of forming the underlying layer 14a needs to be set to a lower temperature than a temperature for dissolving the crystal, and thus it is preferably set to lower than 1200° C. If the temperature of the substrate 2 at the time of forming the underlying layer 14a is in the range of the above-mentioned temperature, the underlying layer 14a having good crystallization will be obtained.

When the single-crystal group-III nitride semiconductor layer is epitaxially grown on the surface of the substrate made of a sapphire, a single crystal oriented in the C-axis direction from the C-plane tends to be epitaxially grown easily, and the single-crystal epitaxial growth tends to be difficult to generate from a surface other than the C-plane. In addition, when the single-crystal group-III nitride semiconductor layer is grown on the surface of the sapphire substrate using the MOCVD method, the single-crystal layer is epitaxially grown from the C-plane, but the single-crystal layer is not epitaxially grown on the surface except the C-plane. Therefore, the growth of the underlying layer 14a is preferably performed by the MOCVD method. In the embodiment, when the single-crystal underlying layer 14a is epitaxially grown on the main surface 20 of the substrate 2, on which the buffer layer 12 is formed, by the MOCVD method, the crystal is not grown from the surfaces 22c of the raised portions 22 having the surfaces 22c nonparallel to the C-plane, but the crystal oriented in the C-axis direction is epitaxially grown only from the flat surface 21 having the (0001) C-plane.

Further, in the substrate 2 on which the raised portions 22 are formed, it is more difficult to laminate the underlying layer 14a having good flatness than in a substrate on which the raised portions 22 are not formed, when the underlying layer 14a is epitaxially grown on the buffer layer 12 formed on the main surface 20 by the MOCVD method. Further, in the underlying layer 14a laminated on the main surface 20 of the substrate 2 on which the raised portions 22 are formed, there is a problem that a tilt of the C-axis direction or a twist of the C-axis and the like deteriorating the crystallization are easily generated. For this reason, when the underlying layer 14a is epitaxially grown on the main surface 20 of the substrate 2, on which the raised portions 22 are formed, by the MOCVD method, the growth conditions are preferably made suitable for the purpose of obtaining the sufficient surface flatness or the good crystallization.

Meanwhile, though the impurities can be doped on the underlying layer 14a as necessary, it is preferable that the impurities are not doped from the viewpoint of the improvement of crystallization.

In addition, it is also possible to form the underlying layer 14a made of a group-III nitride semiconductor by the reactive sputtering method. When the sputtering method is used, an apparatus having a simple configuration is possible as compared to the MOCVD method or the MBE method.

Formation of the n-Type Contact Layer and the n-Type Cladding Layer

Next, the n-type contact layer 14b and the n-type cladding layer 14c are sequentially laminated on the underlying layer 14a formed in each of the above-mentioned conditions and procedures using the MOCVD method known in the related art. As a film formation apparatus for forming the n-type contact layer 14b and the n-type cladding layer 14c, an MOCVD apparatus used in the formation of the above-mentioned underlying layer 14a or the after-mentioned emission layer 15 can be used by appropriately changing various types of conditions.

Formation of the Emission Layer

Next, the emission layer 15 is formed on the n-type cladding layer 14c (n-type semiconductor layer 14) by the MOCVD method known in the related art. As shown in FIG. 4, the emission layer 15 formed in the embodiment is configured such that it has a laminated structure which starts from the GaN barrier layer and ends at the GaN barrier layer, and the seven-layered barrier layer 15a made of GaN and the six-layered well layer 15b made of nondoped $In_{0.2}Ga_{0.8}N$ are alternately laminated. Further, in the manufacturing method of the embodiment, the emission layer 15 can be formed using the same apparatus as the film formation apparatus (MOCVD apparatus) used in the formation of the above-mentioned n-type semiconductor layer 14.

Formation of the p-Type Semiconductor Layer

Next, the p-type semiconductor layer 16 constituted by the p-type cladding layer 16a and the p-type contact layer 16b is formed on the emission layer 15, that is, on the barrier layer 15a which is an uppermost layer of the emission layer 15 using the MOCVD method known in the related art. In the formation of the p-type semiconductor layer 16, the same apparatus as the MOCVD apparatus used in the formation of the n-type semiconductor layer 14 and the emission layer 15 can be used by appropriately changing various types of conditions. In addition, the p-type cladding layer 16a and the p-type contact layer 16b constituting the p-type semiconductor layer 16 can also be formed using the reactive sputtering method.

In the embodiment, the p-type cladding layer 16a made of $Al_{0.1}Ga_{0.9}N$ doped with Mg is first formed on the emission layer 15 (barrier layer 15a of the uppermost layer), and the p-type contact layer 16b made of $Al_{0.02}Ga_{0.98}N$ doped with Mg is further formed thereon. At this time, the same MOCVD apparatus can be used in the lamination of the p-type cladding layer 16a and the p-type contact layer 16b. Meanwhile, as described above, not only Mg, for example, but also zinc (Zn) and the like can be similarly used as a p-type impurity.

Electrode Forming Step

Figure 5:
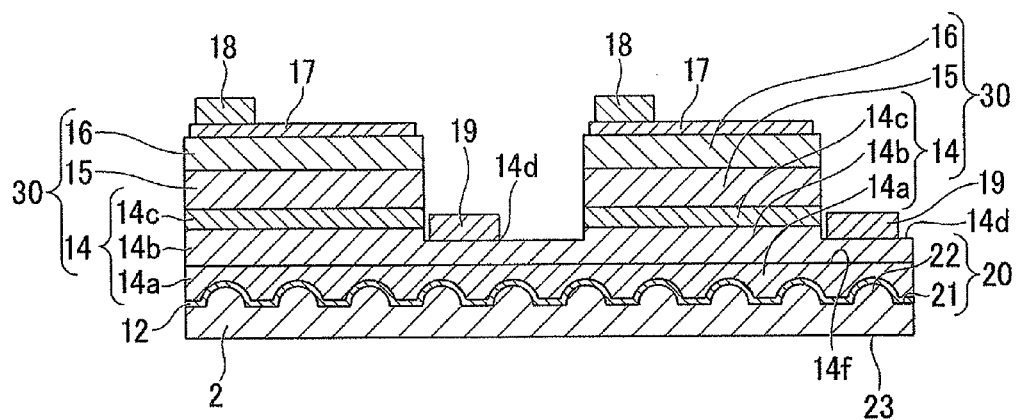
FIG. 5 is a diagram schematically explaining an example of a method of manufacturing the group-III nitride semiconductor light-emitting device according to the invention, and a cross-sectional view illustrating an electrode forming step.

Next, in an electrode forming step, as shown in FIG. 5, after a plurality of translucent positive electrodes 17 is formed at a predetermined position of the p-type semiconductor layer 16, the positive electrode bonding pads 18 are formed on each of the translucent positive electrodes 17, the n-type semiconductor layer 14 is exposed to form a plurality of negative electrode forming regions 14d by etching and removing a predetermined position of the semiconductor layer 30, and a plurality of negative electrode bonding pads 19 is formed on each of the negative electrode forming regions 14d so as to be paired with the positive electrode bonding pads 18.

Formation of the Translucent Positive Electrode

First, the translucent positive electrode 17 made of ITO is formed on the p-type contact layer 16b of the laminated semiconductor 10 in which each of the layers is formed by the above-mentioned method.

A method of forming the translucent positive electrode 17 is not particularly limited, and can be provided by commonly used means widely known in the technical field. In addition, as a structure thereof, any structure including a structure known in the related art can be used without any limitation.

In addition, as described above, a material of the translucent positive electrode 17 is not limited to ITO; the translucent positive electrode can be formed using materials such as AZO, IZO, and GZO.

In addition, after the translucent positive electrode 17 is formed, the thermal annealing for alloying or transparency may or may not be performed.

Formation of the Positive Electrode Bonding Pad and the Negative Electrode Bonding Pad Next, the positive electrode bonding pad 18 is further formed on the translucent positive electrode 17 formed on the laminated semiconductor 10. This positive electrode bonding pad 18 can be formed by laminating, for example, each of the materials of Ti, Al, and Au in order from the surface side of the translucent positive electrode 17 by a method known in the related art.

In addition, when the negative electrode bonding pad 19 is formed, first, the exposed region 14d of the n-type contact layer 14b can be formed by removing a portion of the p-type semiconductor layer 16, the emission layer 15 and the n-type semiconductor layer 14, which are formed on the substrate 2, by a method such as dry etching. The negative electrode bonding pad 19 having a four-layered structure of which the detailed illustration is omitted can be formed by laminating, for example, each of the materials of Ni, Al, Ti, and Au in order from the surface side of the exposed region 14d on this exposed region 14d by a method known in the related art.

Masking Step (Protective Film Forming Step)

Figure 6A:
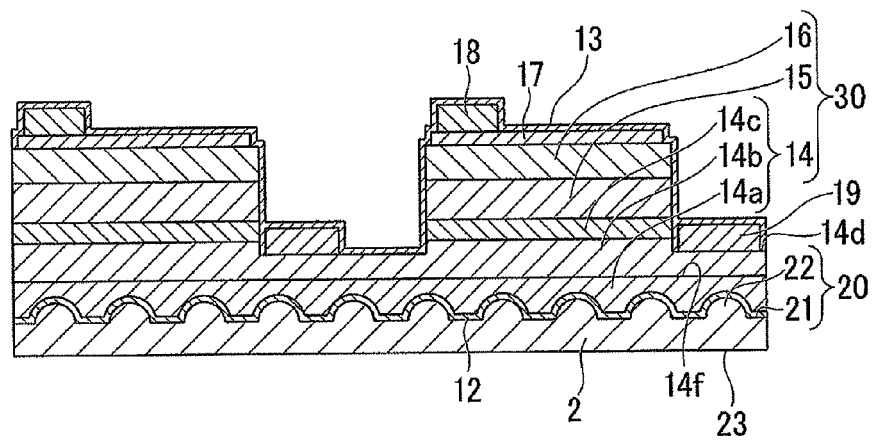
FIG. 6A is a cross-sectional view schematically explaining an example of the method of manufacturing the group-III nitride semiconductor light-emitting device according to the invention, and a schematic diagram illustrating a masking step.
Figure 6B:
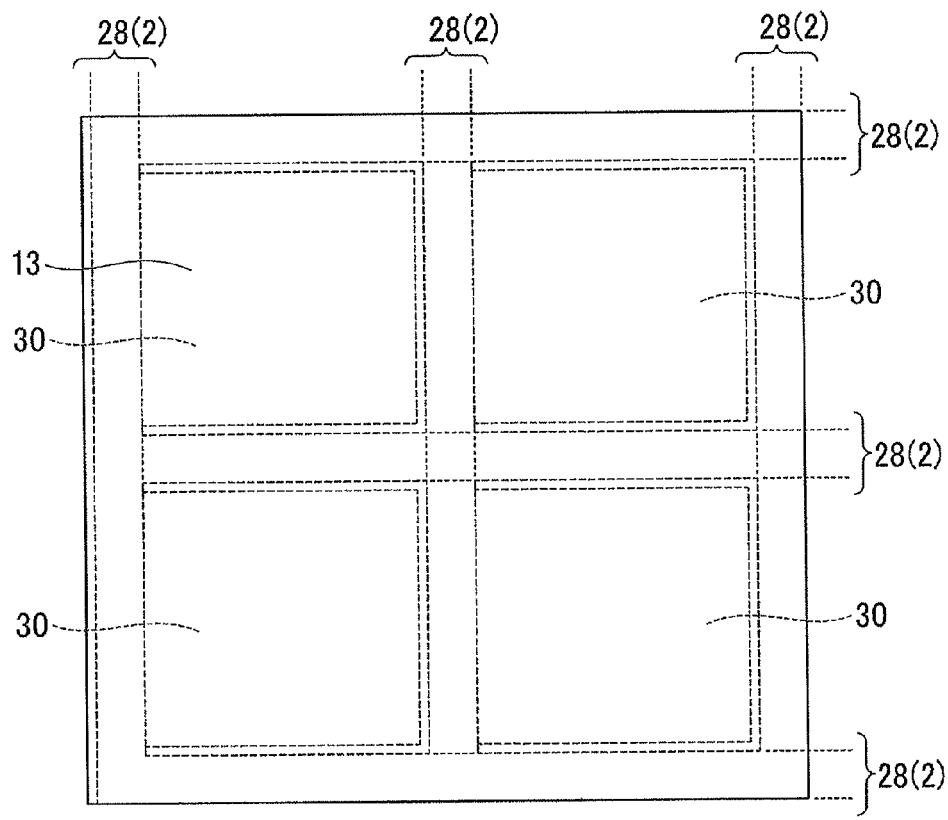
FIG. 6B is a plan view schematically explaining an example of the method of manufacturing the group-III nitride semiconductor light-emitting device according to the invention, and a schematic diagram illustrating the masking step.

Next, in a masking step, as shown in FIGS. 6A and 6B, the protective film 13 is formed on the semiconductor layer 30, and the translucent positive electrode 17, the positive electrode bonding pad 18 and the negative electrode bonding pad 19 which are formed thereon.

In particular, the protective film 13 made of a resin material such as a general resist material is formed on the whole surface of a wafer by using methods such as a spin coater and a spray coater.

Semiconductor Layer Removal Step

Figure 7A:
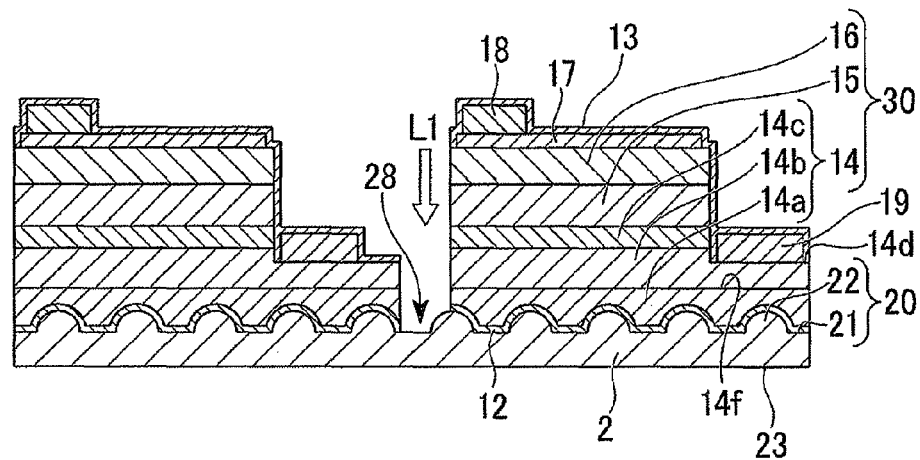
FIG. 7A is a cross-sectional view schematically explaining an example of the method of manufacturing the group-III nitride semiconductor light-emitting device according to the invention, and a schematic diagram illustrating a semiconductor layer removal step.
Figure 7B:
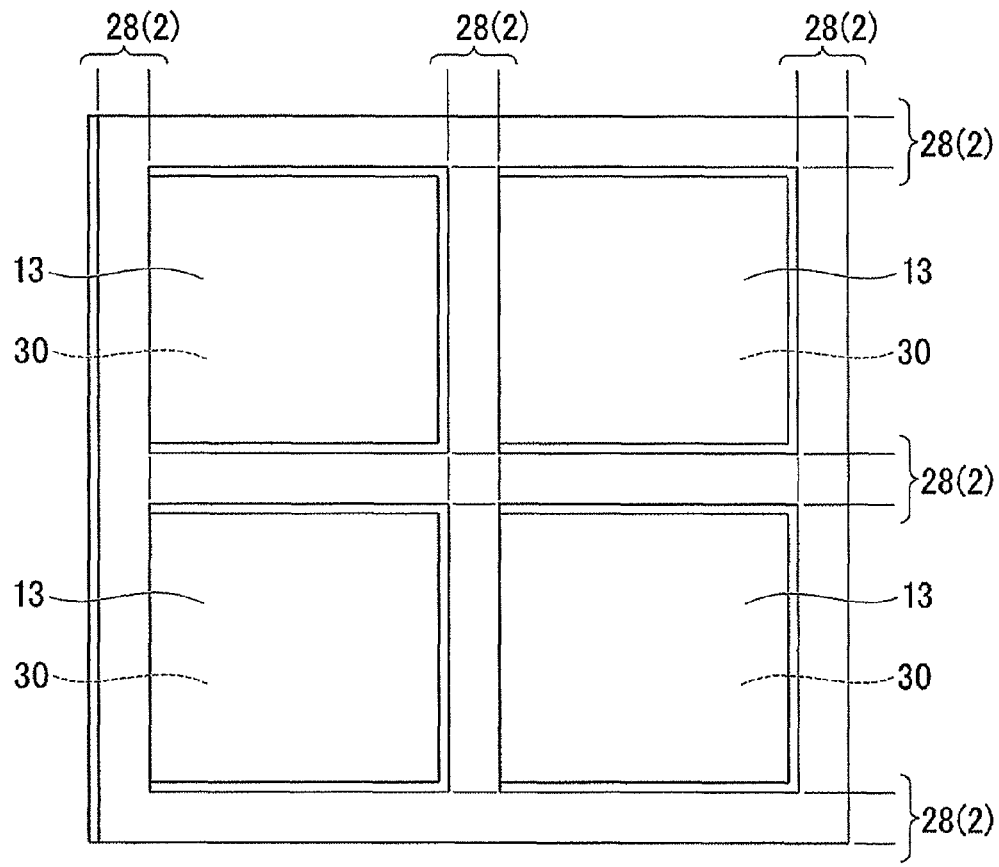
FIG. 7B is a plan view schematically explaining an example of the method of manufacturing the group-III nitride semiconductor light-emitting device according to the invention, and a schematic diagram illustrating the semiconductor layer removal step.

Next, in a semiconductor layer removal step, as shown in FIGS. 7A and 7B, the protective film 13, the semiconductor layer 30 and the buffer layer 12 are removed along the scribing line 28 (see FIGS. 9 and 10) for dividing the substrate 2 to expose the substrate 2 by irradiating the protective film 13, provided on the semiconductor layer 30 in the above-mentioned masking step, with a laser.

In particular, as shown in FIG. 7A, for example, while the protective film 13 provided on the semiconductor layer 30 is irradiated with a laser L1, the step can be performed by a method of moving the laser irradiation position along the above-mentioned scribing line 28 by appropriately moving the substrate 2, that is, the entirety of the wafer. The protective film 13, the semiconductor layer 30 and the buffer layer 12 are divided in a lattice shape on the substrate 2, as shown in FIG. 7B, by performing such a semiconductor layer removal step.

In the semiconductor layer removal step of the embodiment, as a laser applied in order to removing the protective film 13, the semiconductor layer 30 and the buffer layer 12, a YAG laser (semiconductor laser excitation Nd: YAG laser) can be used. Portions within the protective film 13, the semiconductor layer 30 and the buffer layer 12, which are formed on the substrate 2, along the scribing line 28 can effectively removed by using the YAG laser.

In addition, as a laser to be used in the semiconductor layer removal step of the invention, any type of laser can be used insofar as the semiconductor wafer can be formed to be capable of being divided into each chip. In particular, a $CO_2$ laser, a YAG (yttrium, aluminum, garnet) laser as mentioned above, and an excimer laser and the like can be used. Above all, a pulse laser is preferable.

In addition, the wavelength of a laser may be set to a wavelength band of 355 nm, 266 nm and the like, and may be a shorter wavelength.

In addition, the frequency thereof is preferably 1 to 100,000 Hz, and more preferably 30,000 to 70,000 Hz. In addition, the outputs of a laser are different depending on the size of the semiconductor layer to be removed or the like, and the width and the depth of the groove to be formed in the substrate of which the details are described later, but is preferably a minimum output necessary to obtain a desired groove in the substrate. A compound semiconductor as used in the invention has a good absorption efficiency of a laser, and thus processing in a low output is possible. Meanwhile, since the extra laser output gives thermal damage to the substrate or the compound semiconductor, the output is typically preferably equal to or less than 2 W, and more preferably equal to or less than 1 W.

Further, in the semiconductor layer removal step of the embodiment, it is possible to use a method of removing the protective film 13, the semiconductor layer 30 and the buffer layer 12 corresponding to portions along the scribing line (cutting expectation line) 28 for dividing the substrate 2 into a plurality of chips from the side of the substrate 2, on which the semiconductor layer 30 and the protective film 13 are formed, by pulsed irradiation of the surface of the protective film 13 with the laser L1. In addition, it is possible to effectively damage the portions within the protective film 13, the semiconductor layer 30 and the buffer layer 12 along the scribing line 28 by using the method of pulsed irradiation of the substrate with a laser, thereby allowing certain removal to be performed.

Further, in the semiconductor layer removal step of the embodiment, the movement speed at the time of moving the laser irradiation position along the above-mentioned scribing line 28 by moving the substrate 2 is preferably set to be in the range of 60 to 120 mm/sec. When the movement speed of the substrate 2, that is, the laser irradiation position is in this range, damage is effectively given to the portions within the protective film 13, the semiconductor layer 30 and the buffer layer 12 along the scribing line 28, while only these portions can be efficiently removed.

Further, in the semiconductor layer removal step as mentioned above, though influence is also made on the intensity of a laser or the above-mentioned movement speed, there may be a case where the protective film 13, the semiconductor layer 30 and the buffer layer 12 are not only removed, but also a groove is inevitably formed in the surface of the substrate 2. For example, there may be a case where a groove (division groove) having a depth of 5 to 30 μm or so is generated. This portion is a sight portion in which the processing marks 25 (see FIGS. 9 and 10) are formed within the substrate 2 in the laser processing step described later, and is a position to be divided in the division step after that. Thus, such formation of the groove is preferable from the viewpoint of the processes of the invention. In addition, such a groove is formed on the substrate 2, so that the division of the substrate in the division step described later is extremely facilitated, and the special effect is exhibited. In addition, such formation of the groove (division groove) is more preferable from the viewpoint that the effect capable of reducing a bend of the substrate is exhibited in the grinding step and the polishing step described later.

In addition, there may be used a method of removing only the protective film 13, the semiconductor layer 30 and the buffer layer 12, while controlling the intensity of a laser and the like so that the groove (flaw) is not generated on the substrate 2 by appropriately adjusting the strength.

Meanwhile, in the example described in the embodiment, although there is used a method of forming the protective film 13 on the whole surface of the wafer (see the semiconductor layer 30) in the above-mentioned masking step, and removing the protective film 13 together with the semiconductor layer 30 in the semiconductor layer removal step, the invention is not limited to such a method. For example, there can also be used a method of forming the protective film on the semiconductor layer 30, while an exposure band, not shown, is provided to a position along the above-mentioned scribing line 28.

In such a case, there can be used a method in which the patterned mask is formed on the wafer in advance, so that the protective film is formed while the exposure band for dividing the wafer into individual light-emitting device chips is provided on the semiconductor layer, for example, in a lattice shape. In the semiconductor layer removal step, the semiconductor layer and the buffer layer corresponding to these portions can be removed by irradiating the exposed region on the semiconductor layer with a laser, to expose the position of the scribing line on the substrate.

In the semiconductor layer removal step as mentioned above, when the semiconductor layer is irradiated with a laser in a state where the protective film is not formed, cutting scraps generated by laser heating are scattered to the periphery thereof, and these cutting scraps are attached to a device section to generate contamination, which results in damage on the device section. In addition, when the above-mentioned cutting scraps are attached onto the positive electrode bonding pad or the negative electrode bonding pad, there is a problem that lowering of the adhesion properties of wire bonding or solder attaching is caused. As in the example described in the embodiment, it is possible to prevent contamination or damage of the device section, and lowering of adhesion properties at the time of mounting due to contamination of the bonding pad, by covering the device section with the protective film before laser irradiation.

Etching Step

Next, in the manufacturing method of the embodiment, after the above-mentioned semiconductor layer removal step and the laser processing step described later, it is preferable to include an etching step of etching the lateral side 30a of the semiconductor layer 30 and the lateral side 12a of the buffer layer 12 on which the portions along the scribing line 28 for dividing the substrate 2 are removed by the above-mentioned semiconductor layer removal step.

Figure 8:
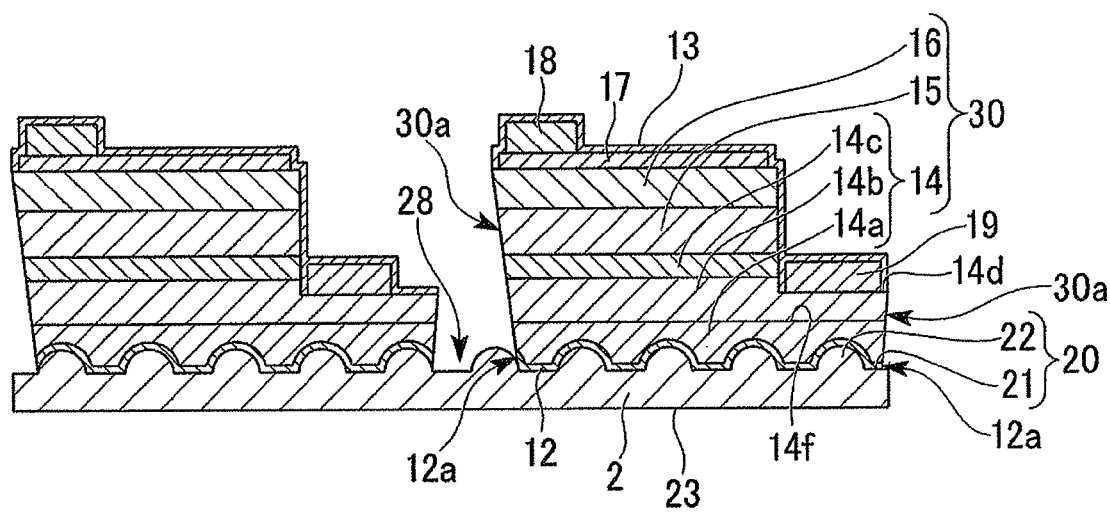
FIG. 8 is a diagram schematically explaining an example of the method of manufacturing the group-III nitride semiconductor light-emitting device according to the invention, and a cross-sectional view illustrating an etching step.

Specifically, as shown in FIG. 8, in the above-mentioned semiconductor layer removal step, the wafer of which the protective film 13, the semiconductor layer 30 and the buffer layer 12 are divided into individual chip units on the substrate 2 is immersed in a phosphoric acid treatment solution to perform wet etching. Thereby, a portion of the division surfaces of the semiconductor layer 30 and the buffer layer 12 to which damage is given is etched and removed with a laser, and the lateral side 30a of the semiconductor layer 30 and the lateral side 12a of the buffer layer 12 can be formed in a reversely-inclined plane shape which is reversely-inclined from the substrate 2 toward the upper portion thereof, as shown in FIG. 8.

In the etching step of the embodiment, as in the shown example, the lateral side 30a of the semiconductor layer 30 (and the lateral side 12a of the buffer layer 12) is formed in a reversely-inclined plane shape which is reversely-inclined from the substrate 2 toward the upper portion thereof, so that the light-emitting device of which the light extraction efficiency from the semiconductor layer 30 (and the buffer layer 12) is raised can be realized.

Meanwhile, the shapes of the lateral sides of the semiconductor layer and the buffer layer formed by the etching step are not limited to the example as shown in FIG. 8 and the like. For example, the lateral side of the semiconductor layer can be formed in a straight shape which vertically extended from the substrate toward the upper side thereof, and the lateral side thereof can also be formed in various types of other shapes by changing the etching conditions.

Protective Film Removal Step

Figure 9:
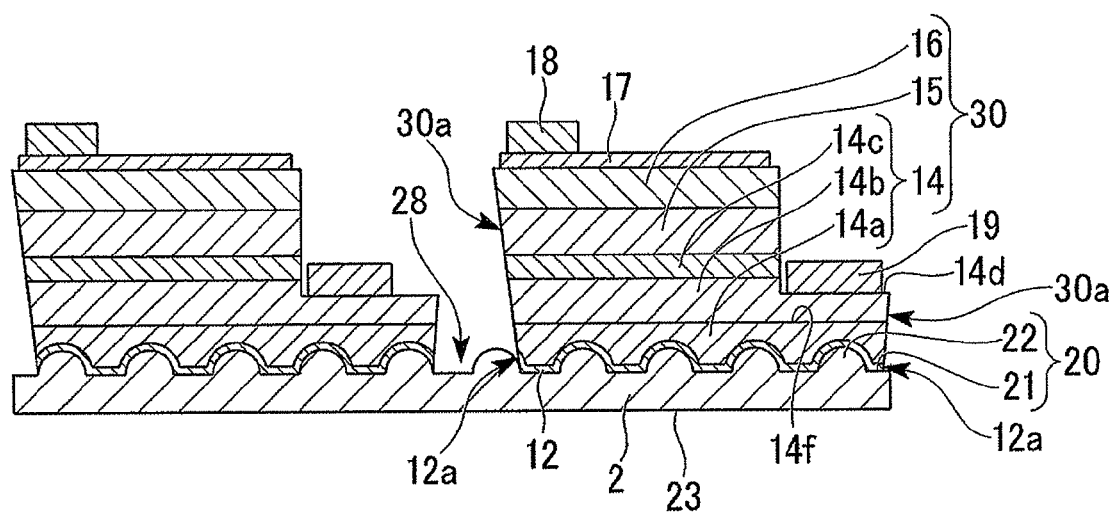
FIG. 9 is a diagram schematically explaining an example of the method of manufacturing the group-III nitride semiconductor light-emitting device according to the invention, and a cross-sectional view illustrating a protective film removal step.

Next, in a protective film removal step, as shown in FIG. 9, the protective film 13 (see FIGS. 6 to 8) formed by the above-mentioned masking step is removed from the wafer.

Specifically, the protective film 13 on the wafer is completely peeled off, using a method of exposure to oxygen plasma and the like.

Grinding Step

Next, in a grinding step, the substrate 2 is thinly processed by grinding the lower surface (second main surface) 23 of the substrate 2.

Specifically, while the detailed illustration is omitted, first, mechanical grinding is performed on the lower surface 23 side of the substrate 2 using a metal grinding wheel or a vitrified grinding wheel and the like based on a natural diamond or a synthesized diamond and the like, and the whole thickness of the substrate 2 is set to 80 to 150 μm or so. The granularity of the above-mentioned grinding wheel used on this occasion can be used to have, for example, #170 to #2000 or so.

Particularly, according the manufacturing method of the invention, when the groove is formed in the substrate 2 by laser irradiation in the above-mentioned semiconductor layer removal step, there is exhibited a special effect that a warpage of the substrate 2 can be reduced, and further, the warpage of the substrate 2 after the grinding step and the polishing step can be considerably reduced by controlling the granularity of abrasive grains in this grinding step and the polishing step described later.

Polishing Step

Next, in a polishing step, polishing (lapping) is performed on the lower surface 23 of the substrate 2 by a separation grinding wheel having a granularity of 1 to 12μ which is made of a polycrystalline diamond, and then the lower surface 23 is formed in a specular surface shape. In addition, polishing may be performed on the lower surface 23 by a method such as, for example, CMP (Chemical Mechanical Polishing).

Temporary Fixing Step

Next, in the manufacturing method of the embodiment, after the above-mentioned grinding step and before the laser processing step described later, there can be used a method including a temporary fixing step of attaching a temporary fixing sheet made of a resin to the substrate 2, as shown in FIG. 10.

Specifically, for example, the lower surface 23 of the substrate 2 formed in a specular surface shape is attached and temporarily fixed onto the temporary fixing sheet 50 made of a resin material by a method such as adhesion and the like.

Figure 12A:
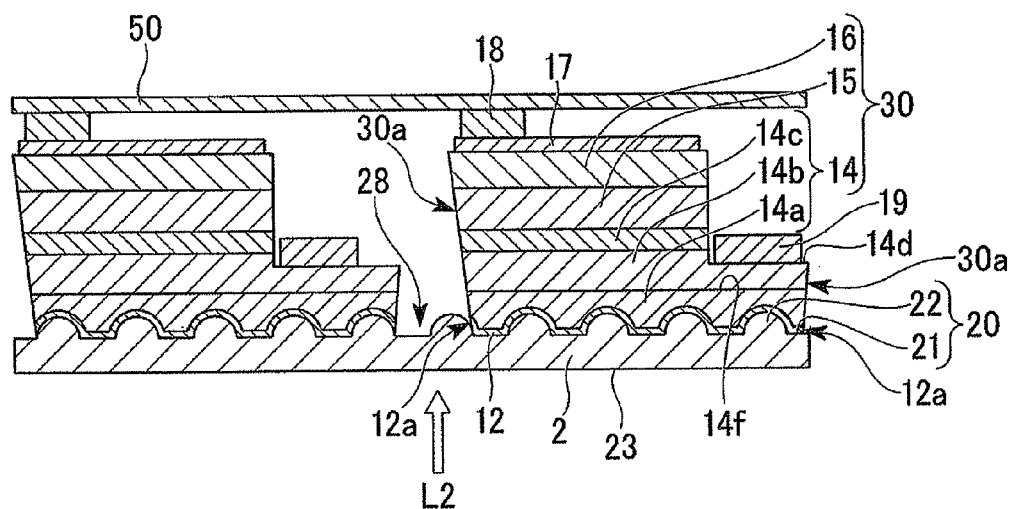
FIG. 12A is a diagram schematically explaining an example of the method of manufacturing the group-III nitride semiconductor light-emitting device according to the invention, a cross-sectional view illustrating the laser processing step, and a schematic diagram illustrating a process of irradiating the substrate with the laser from the lower surface side thereof.
Figure 12B:
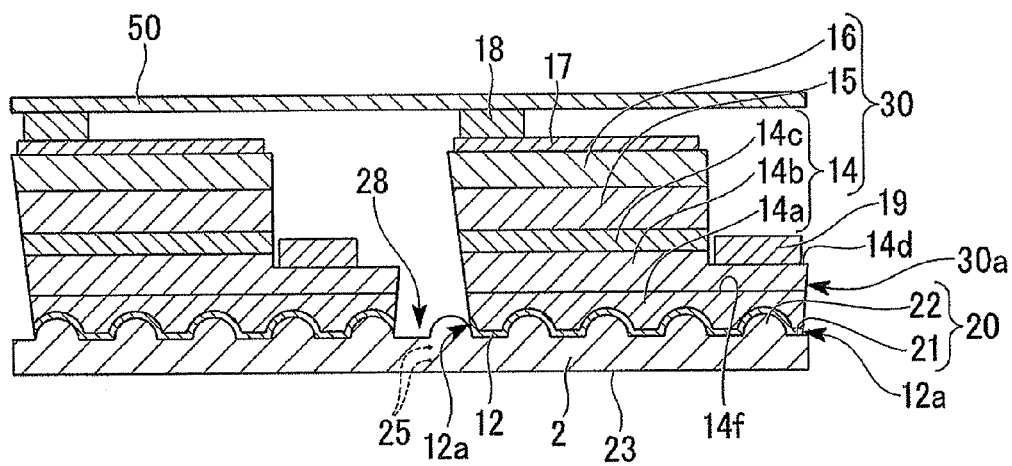
FIG. 12B is a diagram schematically explaining an example of the method of manufacturing the group-III nitride semiconductor light-emitting device according to the invention, a cross-sectional view illustrating the laser processing step, and a schematic diagram illustrating a state where the processing marks are formed by the laser.

Meanwhile, when laser irradiation is performed from the lower surface 23 side of the substrate 2 in the laser processing step described later, the temporary fixing sheet 50 is attached onto the semiconductor layer 30 side, that is, the positive electrode bonding pad 18, in the example, formed on the translucent positive electrode 17 above the semiconductor layer 30, in the temporary fixing step (see the example shown in FIGS. 12A and 12B).

Laser Processing Step

Figure 11A:
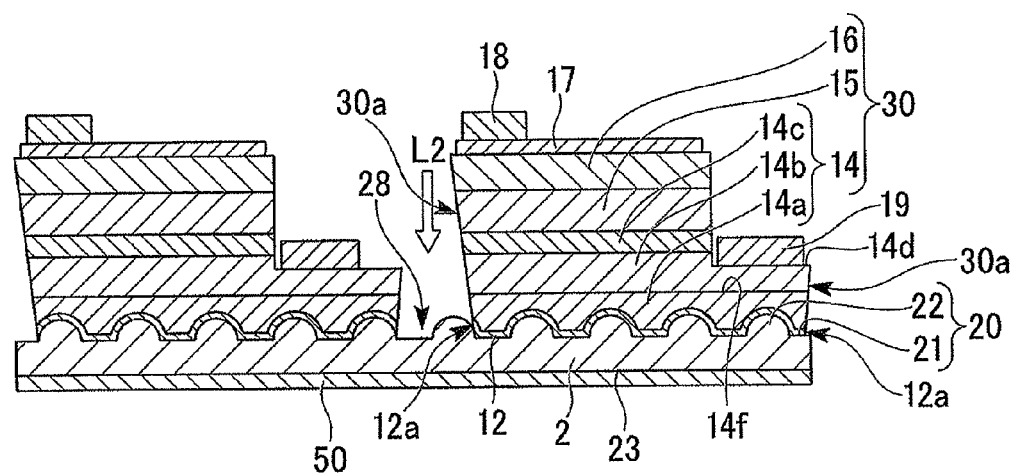
FIG. 11A is a diagram schematically explaining an example of the method of manufacturing the group-III nitride semiconductor light-emitting device according to the invention, a cross-sectional view illustrating a laser processing step, and a schematic diagram illustrating a process of irradiating the substrate with a laser from the main surface side thereof.
Figure 11B:
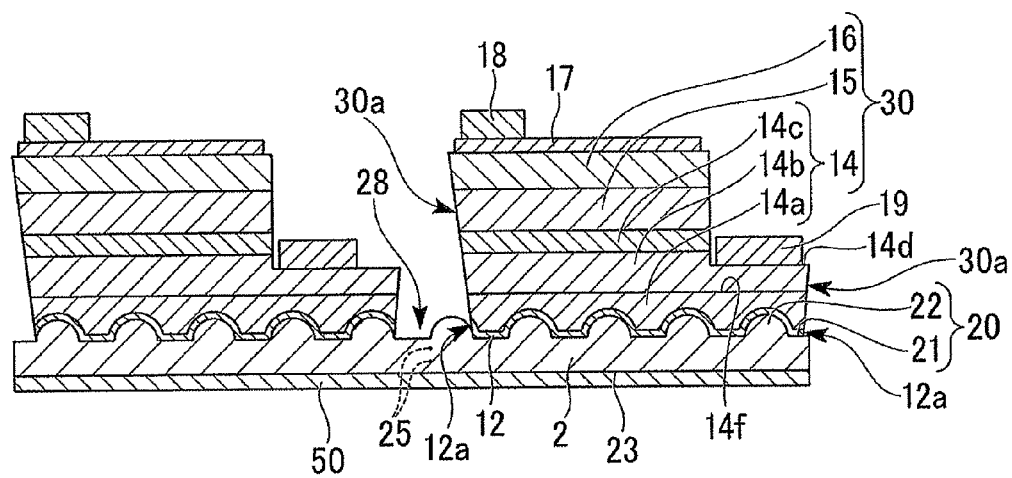
FIG. 11B is a diagram schematically explaining an example of the method of manufacturing the group-III nitride semiconductor light-emitting device according to the invention, a cross-sectional view illustrating the laser processing step, and a schematic diagram illustrating a state where processing marks are formed by the laser.

Next, in a laser processing step, as shown in FIGS. 11A and 11B, the semiconductor layer 30 and the buffer layer 12 are removed on the substrate 2 by the above-mentioned semiconductor layer removal step, and then the processing marks 25 are formed in the inside of the substrate 2 by irradiating the scribing line 28 which is an exposed region with the laser L2. In the example shown in FIG. 11B, the total of two processing marks 25 are formed in a region from the main surface 20 which is a laser irradiation surface of the substrate 2 to the ⅔ portion in the thickness direction of the substrate 2.

Specifically, for example, by using a stealth laser processing apparatus which is not shown, the wafer attached to the temporary fixing sheet 50 is fixed to a sample table included in the stealth laser processing apparatus. By using the sample table included in such a stealth laser processing apparatus, it is possible to fix the wafer attached to the temporary fixing sheet 50 by, for example, a vacuum chuck structure, and to moving this wafer while it is precisely controlled.

First, the temporary fixing sheet 50 to which the substrate 2 is attached is fixed to the sample table of the stealth laser processing apparatus as mentioned above. Next, as shown in FIG. 11A, while the scribing line 28 on the substrate 2 is irradiated with an excimer excitation pulsed laser, the sample table, not shown, to which the temporary fixing sheet 50 is fixed is moved, so that the main surface 20 of the substrate 2 is irradiated with the laser L2 along the scribing line 28. Thereby, as shown in FIG. 11B, the processing marks 25 capable of being divided into individual device units can be formed on the main surface 20 side of the substrate 2 in a lattice shape when seen in a plan view, for example, similarly to the scribing line 28 on the substrate 2 shown in FIG. 7B.

At this time, the focal point of the laser L2 applied to the scribing line 28 on the substrate 2 is changed to form the processing marks 25, so that it is possible to provide processing marks 25 to a plurality of spots (two in FIG. 11B) in the thickness direction of the substrate 2. Thereby, the wafer is easily divided into individual device units in the division step described later.

Laser

As a laser capable of being used in the laser processing step of the embodiment, any type of laser can be used insofar as the substrate made of a sapphire and the like can be processed. For example, though a $CO_2$ laser, a YAG (yttrium, aluminum, garnet) laser and an excimer laser can be used, the pulse irradiation type laser as mentioned above is most preferably used. The processing marks 25 can be efficiently formed at the position of the scribing line 28 of the substrate 2 by using a laser.

The laser mentioned above is linearly applied and scanned so as to be along the scribing line 28 on the substrate 2. In the scribing line 28 to which the laser is applied, a material forming the substrate 2 is heated and sublimated, so that the linear processing marks 25 are formed. As seen from the above, the wavelength of the laser for sublimating the specific region of the substrate 2, herein, the portion of the scribing line 28 or converting it into a material having a small strength is preferably set to 266 nm or 355 nm. When the emission wavelength of the laser is set to this wavelength, the portion of the scribing line 28 of the substrate 2 can be effectively sublimated or converted into a material having a small strength, thereby allowing the processing marks 25 to be efficiently formed.

Further, in the laser processing step of the embodiment, there can be used a method of forming the processing marks 25 by pulsed irradiation of the scribing line 28 on the substrate 2 with a laser, that is, intermittently irradiating. By pulse irradiation with a laser, damage can be effectively given to the inside of the substrate 2, and this portion can be sublimated or converted into a material having a small strength, thereby allowing the processing marks 25 to be efficiently formed.

Further, in the laser processing step of the embodiment, the pulse period in the case of pulse irradiation with a laser is preferably set to be in a range of 10 to 40 kHz. By setting the pulse period of the laser to the above-mentioned range, damage can be effectively given to the inside of the substrate 2, and this portion can be sublimated or converted into a material having a small strength, thereby allowing the periodic processing marks to be reliably formed.

Further, in the laser processing step of the embodiment, the movement speed at the time of moving the laser irradiation position along the scribing line 28 of the substrate 2 is preferably set to a range of 100 to 200 mm/sec. When the movement speed of the laser irradiation position is within this range, damage can be effectively given to the processing spots, thereby allowing the processing marks 25 to be reliably formed.

While the pulse irradiation with a laser along the scribing line 28 of the substrate 2 is performed, the irradiation position is moved at the above-mentioned movement speed, so that the fine and periodic processing marks 25 can be formed on the processing spots. Thereby, when the substrate 2 is divided in the division step described later, a region in which at least a portion of the periodic processing marks 25 mentioned above remains is generated in the division surface (see also the end surface 2a shown in FIG. 1) of the substrate 2, and a region exists in which the fissure marks generated at the time of breaking the substrate 2 along the processing marks 25 remains. Thereby, the nearly whole division surface (end surface 2a) can be formed to have a rough surface.

In addition, the processing marks 25 mentioned above can be formed in a desired pitch by appropriately adjusting the pulse period of the laser or the movement speed of the irradiation position thereof.

Stealth Laser Processing

In a laser processing step of the embodiment, it is preferably to use a method of forming the processing marks 25 in the inside of the substrate 2 by stealth laser processing of performing laser irradiation using the inside of the substrate 2, more specifically, the vicinity of the intermediate portion thereof in the thickness direction of the substrate 2 as a focal point. The processing marks 25 having a shape as mentioned above can be formed by performing the laser processing step by such a method, and a fine fissure starting at the processing marks 25 can be generated in the substrate 2. Thereby, in the division step described later, it is possible to efficiently perform division processing while the division surface (lateral side) is formed to be roughened.

Processing Marks

The processing marks 25 formed in the laser processing step is preferably formed as fine and periodic processing marks as mentioned above, but may be formed as aperiodic processing marks. In addition, the period, the width, the depth and the like of the processing marks 25 can be adjusted in a desired shape by appropriately controlling the intensity or the pulse period of the laser for irradiation, and the movement speed of the irradiation position thereof.

Further, in the laser processing step of the embodiment, as shown in FIG. 11B, the processing marks 25 is preferably formed in a region from the laser irradiation surface (main surface 20 in the shown example) of the substrate 2 to the ⅔ portion in the thickness direction of the substrate 2. The wafer is easily divided into individual device units in the division step described later, by providing the processing marks 25 to the above-mentioned range in the thickness direction of the substrate 2. In the example shown in FIG. 11B, when the thickness of the substrate 2 is 120 μm, the processing marks 25 can be provided to a region from the main surface 20 to the 80 μm position, for example, provided to positions of 40 μm and 80 μm.

In addition, it is more preferable to provide the plural processing marks 25 to a plurality of spots (the total of two in the example shown in FIG. 11B) in the thickness direction of the substrate 2, from the viewpoint of much easier workability in the division step.

When the processing marks 25 are provided to only one spot in the thickness direction of the substrate 2, there may be a concern that in the division step described later, fissures of the substrate 2 are generated in the inside of the substrate 2 from the R-plane forming the processing marks 25 toward many directions, so-called oblique cracks are caused, and the shapes of the devices (chips) after division are not satisfactorily formed, which affects the emission property.

In the embodiment, the plural processing marks 25 are provided to two or more spots in the thickness direction of the substrate 2. Therefore, in the division step described later, it is possible to generate the fissures so as to be lined up between a plurality of processing marks 25, to easily divide the division surface of the substrate 2 while it is formed to be roughened, and to easily divide the division surface even when a thick substrate is used.

Meanwhile, when the plural processing marks 25 are provided in the thickness direction of the substrate 2, it is preferable from the viewpoint of laser characteristics that the processing marks 25 is first formed at a position away from the laser irradiation surface side (main surface 20 side in the example of FIG. 11B), and then the processing marks 25 are formed at a position nearer to the laser irradiation surface side.

Laser Irradiation Position

In the laser processing step mentioned above, although the example, as shown in FIGS. 11A and 11B, is described in which the scribing line 28 of the main surface 20 side of the substrate 2 is irradiated with a laser, the example is not limited thereto in the invention. That is, in the laser processing step of the invention, there can be also used a method of forming the processing marks by laser irradiation from the lower surface (second main surface) 23 side of the substrate 2, as shown in FIGS. 12A and 12B. When such a method is used, as shown in FIG. 12A, the temporary fixing sheet 50 is first attached to the positive electrode bonding pad 18 formed on the translucent positive electrode 17 of the semiconductor layer 30 side, in the temporary fixing step which is the previous step. As shown in FIG. 12A, the lower surface 23 of the substrate 2 is irradiated with a laser along a position corresponding to the scribing line 28 of the main surface 20 side, so that the processing marks 25 can be formed in a region from the lower surface 23 to the ⅔ portion in the thickness direction of the substrate 2, as shown in FIG. 12B. In the shown example, the processing marks 25 are formed at the total of two spots of the above-mentioned region in the thickness direction of the substrate 2.

The manufacturing method of the invention includes the semiconductor removal step ahead of the laser processing step of providing the processing marks 25 to the substrate 2, and the semiconductor layer 30 formed on the main surface 20 is previously removed along an exposure band 31 in the above-mentioned semiconductor removal step. As seen from the above, if the semiconductor layer 30 is not reliably removed before the laser processing step of providing the processing marks 25 to the substrate 2, there may be a concern that so-called debris or burn is generated in the semiconductor layer by laser irradiation in the laser processing step, and thus the characteristics of the light-emitting device chip are lowered.

In the invention, the semiconductor layer 30 is previously removed along the exposure band 31 by the above-mentioned semiconductor removal step. Therefore, not only when laser irradiation from the main surface 20 side of the substrate 2 is performed as shown in FIGS. 11A and 11B, but also when a method of performing laser irradiation from the lower surface 23 side of the substrate 2 is used as shown in FIGS. 12A and 12B, there is no case where damage that causes lowering of the device characteristics is given to the semiconductor layer 30, in the laser processing step or the division step described later. In addition, division processing can be efficiently performed without generating a fault in break division and the like in the division step described later.

In addition, the laser processing step of the embodiment is not limited to the methods of performing laser irradiation from one of the lower surface 23 side or the main surface 20 side as shown in FIGS. 11A and 11B, or FIGS. 12A and 12B, and there can also be used a method of forming the processing marks by laser irradiation from both surface sides of the lower surface 23 and the main surface 20 of the substrate 2.

Division Step

Figure 13A:
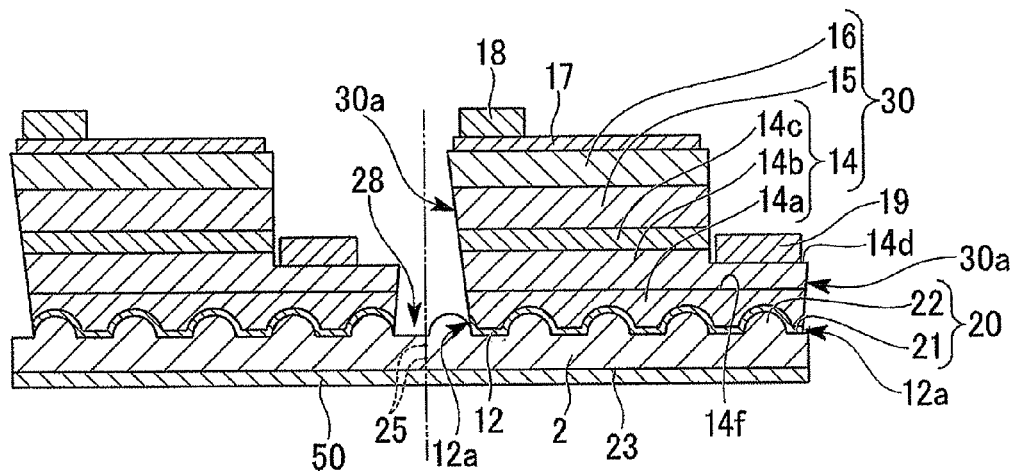
FIG. 13A is a diagram schematically explaining an example of the method of manufacturing the group-III nitride semiconductor light-emitting device according to the invention, a cross-sectional view illustrating a division step, and a schematic diagram illustrating a process of pressing and splitting the substrate along the processing marks.
Figure 13B:
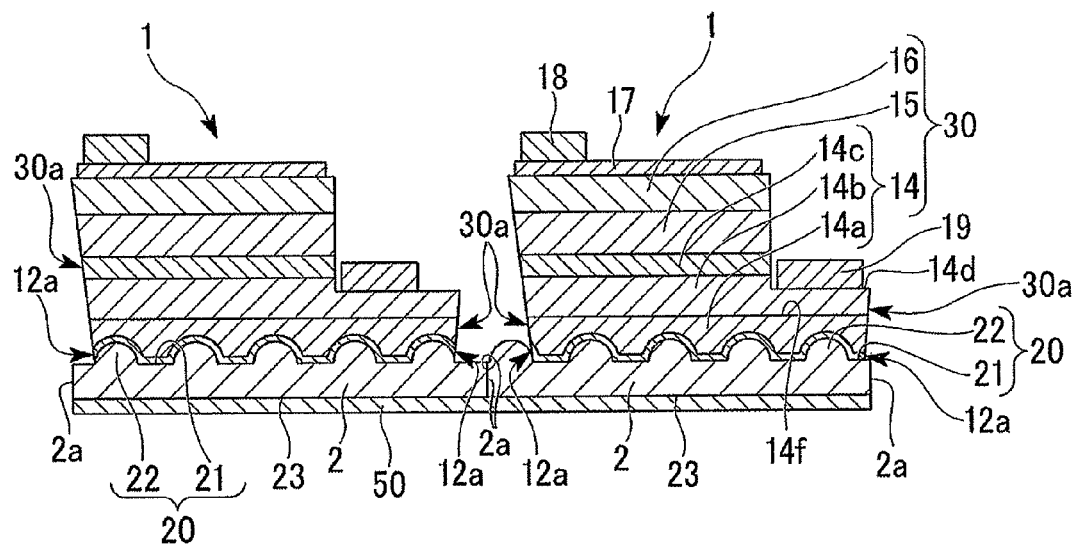
FIG. 13B is a diagram schematically explaining an example of the method of manufacturing the group-III nitride semiconductor light-emitting device according to the invention, a cross-sectional view illustrating the division step, and a schematic diagram illustrating divided chips.

Next, in a division step, as shown in FIGS. 13A and 13B, the substrate 2 is cut along the processing marks 25 formed in the above-mentioned laser processing step, and is divided into a plurality of chips (light-emitting devices 1).

Specifically, for example, by using an apparatus, not shown, and the like called a breaker, the temporary fixing sheet 50 to which the wafer is attached, as shown in FIG. 13A, is mounted on a mounting table of the breaker, and a blade is pressed from the upper side of the wafer along the processing marks 25 formed in the substrate 2, so that the substrate 2 is broken along the processing marks 25, and is divided into a plurality of chips as shown in FIG. 13B. The temporary fixing sheet 50 to which a plurality of chips mentioned above is attached is detached from the breaker.

In the division step of the embodiment, the substrate 2 is cut into the individual light-emitting device unit chips along the processing marks 25 by the above-mentioned procedure, so that the wafer can be divided into the light-emitting devices 1 of the individual chips while the fissures are generated in the substrate 2 with the processing marks 25 used as the starting point. On this occasion, as mentioned above, a region in which at least a portion of the periodic processing marks 25 remains, and a region in which the fissure marks generated in the division surface (end surface 2a) at the time of cutting the substrate 2 remains irregularly exist in the end surface 2a of the substrate 2 after division, and the division surface, that is, the nearly whole end surface 2a is formed to have a rough surface. As seen from the above, by forming the end surface 2a of the substrate 2 to have a rough surface, the surface area of the end surface 2a increases, and the substrate 2 capable of efficiently emitting incident light to the outside can be used, thereby allowing the light-emitting device 1 having an excellent light extraction efficiency to be manufactured.

Further, in the division step of the embodiment, when the groove is formed on the scribing line 28 of the substrate 2 by the above-mentioned semiconductor layer removal step, the fissure can be generated in the substrate 2, with the groove on the scribing line 28 used as the starting point likewise, in addition to the processing marks 25 within the substrate 2. Thereby, the wafer can be much easily divided into the light-emitting devices 1 of the individual chips.

Sheet Peeling Step

Next, in the manufacturing method of the embodiment, after the above-mentioned division step, the temporary fixing sheet 50 (see FIG. 13 and the like) attached to the lower surface 23 of the substrate 2 in the above-mentioned temporary fixing step is heated and expanded. Thereby, a plurality of chips (light-emitting devices 1) is respectively separated from each other, and then as shown in FIG. 14, it is preferable to include the sheet peeling step of detaching each of the chips from the temporary fixing sheet 50.

Specifically, first, the temporary fixing sheet 50 is heated and expanded by heating means such as an electrical heating apparatus which is not shown, and the chips of a plurality of light-emitting devices 1 are respectively separated by a predetermined distance from each other. Next, as shown in FIG. 14, the chips of a plurality of light-emitting devices 1 are respectively detached from the temporary fixing sheet 50.

In addition, even when a method of attaching the temporary fixing sheet 50 onto the semiconductor layer 30 side, that is, the positive electrode bonding pad 18 is used, the chips of the light-emitting devices 1 can be detached from the temporary fixing sheet 50 by the same method.

Through each of the steps mentioned above, the wafer in which the semiconductor layer 30 including the buffer layer 12 and the underlying layer 14a, the translucent positive electrode 17, the positive electrode bonding pad 18 and the negative electrode bonding pad 19 are provided on the substrate 2 is divided in a square shape having a side of, for example, 350 μm, thereby allowing the light-emitting devices 1 to be obtained.

A method of manufacturing a group-III nitride semiconductor device of the embodiment as described above includes an epitaxial step, a masking step of forming the protective film 13, a semiconductor layer removal step of removing the protective film 13 and the semiconductor layer 30 by laser irradiation, a grinding step of reducing the thickness of the substrate 2, a polishing step of polishing the substrate 2, a laser processing step of providing the processing marks 25 to the inside of the substrate 2, and a division step of forming the division surface (end surface 2a) of the substrate 25 to have a rough surface. Therefore, it is possible to form the end surface 2a of the substrate 2 to have a rough surface without giving damage to the semiconductor layer 30 and without lowering the device characteristics, as a result, to raising the internal quantum efficiency and the light extraction efficiency, and to manufacture the group-III nitride semiconductor light-emitting device 1 having a high emission output.

Further, according to the manufacturing method of the embodiment, when the groove (division groove) is formed in the substrate 2 by laser irradiation in the semiconductor layer removal step, it is possible to reduce the warpage of the substrate 2 included in the light-emitting device 1, and to considerably reduce the warpage of the substrate 2 after the grinding step and the polishing step by controlling the granularity of abrasive grains used in the grinding step and the polishing step.

In addition, according to the manufacturing method of the embodiment, it is possible to manufacture the light-emitting device 1 with a high degree of accuracy and with a high productive efficiency (high yield rate) by two laser irradiation steps (semiconductor layer removal step and laser processing step), in virtue of the contribution of the above-mentioned effects.

As a result, it is possible to realize the group-III nitride semiconductor light-emitting device 1 having a high emission output excellent in the internal quantum efficiency and the light extraction efficiency by the manufacturing method of the invention.

Lamp

It is possible to form a lamp through means well known to those skilled in the art by the combination of a group-III nitride semiconductor light-emitting device of the invention, as described above, and a phosphor. From the related art, a technique for changing an emission color by the combination of the light-emitting device and the phosphor has been known, and such a technique can be adopted without any limitations.

For example, emission having a longer wavelength than that of the light-emitting device can be obtained by appropriately selecting the phosphor, and a lamp exhibiting white emission can be used by the combination of an emission wavelength of the light-emitting device itself and a wavelength converted by the phosphor.

In addition, a lamp can be also used for any applications such as a general-use bullet type, a side-view type for use in a portable backlight, and a top-view type used in a display apparatus.

For example, as shown in FIG. 15, when the group-III nitride semiconductor light-emitting device 1 of the same surface electrode type is mounted in a bullet type lamp, the light-emitting device 1 is attached to one of two frames (frame 41 in FIG. 15), and a negative electrode (see symbol 19 shown in FIG. 1) of the light-emitting device 1 is bonded to a frame 42 through a wire 44. A positive electrode bonding pad 18 of the light-emitting device 1 is bonded to the frame 41 through a wire 43. A bullet type lamp 4 as shown in FIG. 15 can be produced by molding the periphery of the light-emitting device 1 with a mold 45 made of a transparent resin.

The lamp 4 of the embodiment includes the group-III nitride semiconductor light-emitting device 1 of the embodiment, and thus the lamp has an excellent emission property.

Other Semiconductor Devices

The group-III nitride semiconductor device, obtained in the embodiment, which includes excellent crystallization can also be used in a photoelectric conversion device such as a laser device or a light receiving device, or an electronic device such as HBT (Heterojunction Bipolar Transistor) or HEMT (High Electron Mobility Transistor), in addition to the semiconductor layer included in the light-emitting device such as a light-emitting diode (LED) or a laser device (LD) as mentioned above. A lot of semiconductor devices having various types of structures are well known, and the laminated structure of the group-III nitride semiconductor according to the invention includes these well-known device structures, without any limitations.

Hereinafter, a group-III nitride semiconductor device, a method of manufacturing the same, a group-III nitride semiconductor light-emitting device, and a method of manufacturing the same according to the invention will be described in more detail, referring to examples. However, the invention is not limited to these examples.

EXAMPLE

FIGS. 1 to 4 are schematically cross-sectional views for explaining a laminated structure of a group-III nitride semiconductor light-emitting device produced in this example.

In this example, a single-crystal layer made of AlN used as the buffer layer 12 was formed, at a thickness of 40 nm, on the main surface 20 of the substrate 2, made of a sapphire, provided with the raised portions 22, and a layer, made of GaN (group-III nitride semiconductor), having a thickness of 6 µm was formed thereon as the underlying layer 14a included in the n-type semiconductor layer 14. Further, a semiconductor laminated wafer having an LED structure (semiconductor layer 30) was formed by sequentially laminating each of the layers of a layer, made of Si-doped GaN, having a thickness of 2 µm used as the n-type contact layer 14b included in the n-type semiconductor layer 14, the n-type cladding layer 14c having a thickness of 60 nm with a superlattice structure of Si-doped InGaN and GaN, the emission layer 15 having a thickness of 50 nm with a multiple quantum well structure formed by six times repetition of the well layer 15b, made of InGaN, having a thickness of 2 nm and the barrier layer 15a, made of Si-doped GaN, having a thickness of 5 nm, the p-type cladding layer 16a having a thickness of 15 nm with a superlattice structure of Mg-doped GaN and Mg-undoped GaN, and the p-type contact layer 16b, made of Mg-doped GaN, having a thickness of 20 nm. The light-emitting device 1 shown in FIG. 1 was produced by sequentially laminating the translucent positive electrode 17 and the positive electrode bonding pad 18 on the p-type contact layer 16b, and removing a predetermined region of the n-type semiconductor layer 14 to form the negative electrode bonding pad 19 on the n-type contact layer 14b. A light-emitting diode (lamp 4) shown in FIG. 15 was finally produced by disposing this light-emitting device 1 on a lead frame, and connecting it to the lead frame with a gold wire.

Processing of Substrate

A substrate made of a sapphire is first prepared, and on the C-plane of this substrate, the basal portion width is set to 2.2 µm, the height is set to 1.0 µm, and the basal portion width/4 is set to 0.6 µm, and the interval between the adjacent raised portions is set to 1.8 µm. In addition, a plurality of raised portions 22 was formed by the following procedure in a state where the C-plane does not exist in the surfaces of the raised portions.

That is, a mask was formed on the sapphire substrate of the C-plane having a diameter of 2 inches using a photolithography method heretofore known, and the raised portions 22 in the above-mentioned were formed by etching the substrate using a dry etching method. Meanwhile, a stepper exposure method using ultraviolet light was used as an exposure method. In addition, a mixed gas of $BCl_3$ and $Cl_2$ was used in dry etching.

The raised portions 22 formed in this way are such that the planar shape of the basal portion is circular, the external contour becomes gradually smaller in an upward direction, and the lateral side has an outwardly curved bowl-like (hemispherical) shape.

Formation of the Buffer Layer

First, the substrate 2, made of a C-plane sapphire having a diameter of 2 inches, that includes the main surface (first main surface) 20 on the raised portions 22 are formed as mentioned above was washed by a hydrofluoric acid and an organic solvent, and then was introduced into the chamber. In this case, as a sputtering apparatus, there was used an apparatus including a high-frequency power source, and a mechanism capable of moving a position of a magnet within a target. Meanwhile, a target made of metal Al was used.

The substrate 2 was heated up to 500° C. within the chamber, a nitrogen gas was introduced into the chamber at a flow rate of 15 sccm, and then the pressure within the chamber was maintained at 1.0 Pa, a high-frequency bias of 50 W was applied to the substrate 2 side, and the surface of the substrate 2 was exposed to nitrogen plasma, to thereby cause the surface to be washed.

Next, while the temperature of the substrate 2 was kept as it was, argon and nitrogen gases were introduced into the sputtering apparatus. In the conditions where a high-frequency bias of 2000 W was applied to the metal Al target side, the pressure within the furnace was kept at 0.5 Pa, the Ar gas was circulated at 5 sccm and the nitrogen gas was circulated at 15 sccm (the ratio of nitrogen in the whole gases is 75%), the single-crystal buffer layer 12m made of AlN was formed on the main surface 20 of the substrate 2 by covering the flat surface 21 and the raised portions 22. The magnet within the target was trembled in any cases of the washing and the formation of the substrate 2.

AlN (buffer layer 12) of 40 nm was formed by treatment for the prescribed time in accordance with the previously measured film formation speed (0.08 nm/s), and then the plasma operation was stopped, and the temperature of the substrate 2 was lowered.

Formation of n-Type Semiconductor Layer

Next, the substrate 2 on AlN (buffer layer 12) was formed was taken out from the sputtering apparatus and transferred into the MOCVD apparatus. The n-type semiconductor layer 14 was then formed on the buffer layer 12 by the following procedure.

Formation of the Underlying Layer

The underlying layer 14a made of GaN was formed on the buffer layer 12 by the following procedure. Here, as an MOCVD apparatus used for formation of the underlying layer 14a, an MOCVD apparatus known in the related art was used.

The substrate 2 was first introduced into the reacting furnace (MOCVD apparatus), and then was mounted on a carbon susceptor for heating within a glove box in which the nitrogen gas was substituted. Next, after the nitrogen gas was circulated into the reacting furnace, the substrate temperature was raised to 1150° C. by operating a heater. After the temperature was confirmed to be stabilized at 1150° C., a valve of an ammonia gas pipeline was opened, and then circulation of the ammonia gas into the reacting furnace was started.

Next, hydrogen including TMG vapor was supplied into the reacting furnace, and then a step of forming a group-III nitride semiconductor (GaN) forming the underlying layer 14a on the buffer layer 12 was started. The ammonia amount on this occasion was regulated so that the V/III ratio was set to 6000. In this way, after GaN was grown over about one hour, a valve of a TMG pipeline was switched, and the supply of raw materials to the reacting furnace was completed to stop the growth of GaN. The electrical supply to the heater was stopped, and the substrate temperature dropped to a room temperature.

By the above-mentioned steps, the underlying layer 14a, made of GaN, having a thickness of 2 μm which is undoped was formed on the buffer layer 12, made of AlN, having a single crystal structure formed on the substrate 2. A sample taken out from the reacting furnace after the film formation was clear and colorless, and the surface of the GaN layer (underlying layer 14a) was a specular surface.

Formation of the n-Type Contact Layer

Next, the n-type contact layer made of GaN was formed using the same apparatus as the MOCVD apparatus used for the formation of the underlying layer 14a. In this case, the formation thereof was performed in the same conditions as those of the underlying layer 14a, except that the n-type contact layer was doped with Si, and that in the crystal growth, $SiH_4$ was circulated as a dopant raw material of Si.

By the steps as described above, the buffer layer 12, made of AlN, having a single crystal structure was formed on the substrate 2, made of a sapphire, in which reverse sputtering was performed on the surface thereof, and the GaN layer (n-type underlying layer 14a) having a thickness of 2 μm which is undoped, and the Si-doped GaN layer (n-type contact layer 14b) having a thickness of 2 μm with a carrier concentration of $5 \times 10^{18}$ cm$^{-3}$ were formed thereon.

Formation of the n-Type Cladding Layer

The n-type cladding layer 14c was laminated on the n-type contact layer of the sample produced by the above-mentioned procedure, using the same MOCVD method, by a procedure to be described below.

While ammonia was first circulated into the chamber of the MOCVD apparatus, the temperature of the substrate on which the n-type contact layer made of Si-doped GaN was grown was lowered to 760° C., using the carrier gas as nitrogen.

In this case, while waiting for change in the temperature within the furnace, the supply amount of $SiH_4$ was set. Calculation was performed beforehand on the amount of $SiH_4$ to be circulated, and the amount was adjusted so that the electron concentration of the Si-doped layer was set to $4 \times 10^{18}$ cm$^{-3}$. Ammonia continued to be supplied to the furnace at a flow as it was.

Next, while ammonia was circulated into the chamber, an $SiH_4$ gas, and vapor of TMI and TEG generated by bubbling were circulated into the furnace, and then a layer made of $Ga_{0.99}In_{0.01}N$ was formed at a thickness of 1.7 nm, and a layer made of GaN was formed at a thickness of 1.7 nm, respectively. After such film formation steps were repeatedly performed nineteenth cycles, a layer made of $Ga_{0.99}In_{0.01}N$ was finally grown at a thickness of 1.7 nm once again. In addition, circulation of $SiH_4$ continued during performance of this step. Thereby, the n-type cladding layer 14c having a superlattice structure of Si-doped $Ga_{0.99}In_{0.01}N$ and GaN was formed.

Formation of the Emission Layer

Next, the emission layer 15, having a multiple quantum well structure, which is constituted by the barrier layer 15a made of GaN and the well layer 15b made of $In_{0.2}Ga_{0.8}N$ was formed. When this emission layer 15 was formed, the barrier layer 15a was first formed on the n-type cladding layer 14c made of Si-doped $In_{0.01}Ga_{0.99}N$, and the well layer 15b made of $In_{0.2}Ga_{0.8}N$ was formed on this barrier layer 15a. After six repetition of such a lamination procedure, a seventh barrier layer 15a was formed on the sixth well layer 15b, to make a structure in which the barrier layers 15a were disposed on both sides of the emission layer 15 having a multiple quantum well structure.

First, while the substrate temperature was kept at 760° C., the supply of TEG and $SiH_4$ into the furnace was started to form an initial barrier layer made of Si-doped GaN at a thickness of 0.8 nm for a predetermined time. Then, the supply of TEG and $SiH_4$ was stopped. Thereafter, the temperature of the susceptor was raised to 920° C. The supply of TEG and $SiH_4$ into the furnace was then started again. While the substrate temperature was kept a 920° C., an intermediate barrier layer having a thickness of 1.7 nm was further grown, and then the supply of TEG and $SiH_4$ into the furnace was stopped. Subsequently, the susceptor temperature was lowered to 760° C., and the supply of TEG and SiH$_4$ was started. After a final barrier layer having a thickness of 3.5 nm was further grown, the supply of TEG and SiH$_4$ was stopped again to complete the growth of the GaN barrier layer. By the above three-step film formation process, an Si-doped GaN barrier layer (barrier layer 15a) constituted by three layers of the initial barrier layer, the intermediate barrier layer and the final barrier layer was formed at a total thickness of 5 nm. The amount of SiH$_4$ was adjusted so that the Si concentration was set to $1\times10^{17}$ cm$^{-3}$.

Next, after the growth of the barrier layer 15a was completed, and while the temperature of the substrate 2, the pressure within the furnace, and the flow rates or types of the carrier gas were kept as they are, the valves of TEG and TMI were switched to supply TEG and TMI into the furnace, and the well layer 15b made of In$_{0.2}$Ga$_{0.8}$N was grown. Thereby, the well layer 15b having a thickness of 2 nm was formed.

After the growth of the above-mentioned GaN barrier layer (barrier layer 15a) was completed, TEG and TMIn were supplied into the furnace to perform the formation process of the well layer, and a layer (well layer 15b), made of the Ga$_{0.92}$In$_{0.08}$N, having a thickness of 2 nm was formed.

After the growth of the well layer 15b made of Ga$_{0.92}$In$_{0.08}$N was completed, the supply amount of TEG was changed. Continuously, the supply of TEG and SiH$_4$ was started again, and the second barrier layer 15a was formed.

Through six times repetition of the above-mentioned procedure, six barrier layers 105a made of Si-doped GaN and six well layers 105b made of Ga$_{0.92}$In$_{0.08}$N were formed.

After the sixth well layer 15b made of Ga$_{0.92}$In$_{0.08}$N was formed, the seventh barrier layer was formed continuously. In the formation of the seventh barrier layer, first, the supply of SiH$_4$ was stopped to form the initial barrier layer made of undoped GaN, and then while the supply of TEG into the furnace was continued, the substrate temperature was raised to 920° C. After the intermediate barrier layer was grown at this substrate temperature of 920° C. in the prescribed time, the supply of TEG into the furnace was stopped. Subsequently, the substrate temperature was lowered to 760° C., and the supply of TEG was started. After the growth of the final barrier layer was performed, the supply of TEG was stopped again to complete the growth of the GaN barrier layer. Thereby, the barrier layer, made of undoped GaN, constituted by three layers of the initial barrier layer, the intermediate barrier layer and the final barrier layer was formed at a total of thickness of 4 nm (see the uppermost barrier layer 15a within the emission layer 15 shown in FIG. 4).

By the above procedure, the emission layer 15 of a multiple quantum well structure including the well layers having a non-uniform thickness (see the first to fifth well layers 15b from the n-type semiconductor layer 14 side in FIG. 4) and the well layers having a uniform thickness (see the sixth well layer 15b from the n-type layer 14 side in FIG. 4) was formed.

Formation of the p-Type Semiconductor Layer

Subsequently to each of the above steps, by using the same MOCVD apparatus, the p-type cladding layer 16a having a superlattice structure constituted by four layers made of non-doped Al$_{0.06}$Ga$_{0.94}$N and three layers made of Mg-doped GaN was formed, and the p-type contact layer 16b made of Mg-doped GaN was further formed thereon at a thickness of 200 nm, to thereby form the p-type semiconductor layer 16.

First, while the NH$_3$ gas was being supplied, the substrate temperature was raised to 975° C., and then the carrier gas was switched from nitrogen to hydrogen at this temperature. Subsequently, the substrate temperature was changed to 1050° C. A layer made of non-doped Al$_{0.06}$Ga$_{0.94}$N was formed at a thickness of 2.5 nm by supplying TMG and TMAl into the furnace. Subsequently, with no interval, the valve of TMAl was closed and the valve of Cp$_2$Mg was opened, to form a layer made of Mg-doped GaN at a thickness of 2.5 nm.

Such an operation was repeatedly performed three times, and a layer made of undoped Al$_{0.06}$Ga$_{0.94}$N was finally formed, to thereby form the p cladding layer 16a having a superlattice structure.

Thereafter, only Cp$_2$Mg and TMG were supplied into the furnace, to form the p-type contact layer 16b made of p-type GaN at a thickness of 200 nm.

Thereby, finally, the p-type semiconductor layer 16 was formed which is constituted by the p-type cladding layer 16a having a thickness of 15 nm, and the p-type contact layer 16b, made of Mg-doped Al$_{0.02}$Ga$_{0.98}$N, having a thickness of 20 nm.

The epitaxial wafer for an LED produced in the above manner has a structure in which, on the substrate 2, made of a sapphire, having the C-plane, the AlN layer (buffer layer 12) having a thickness of 40 nm with a single-crystal structure is formed, followed by the lamination of, sequentially from the substrate 2 side, the undoped GaN layer (underlying layer 14a) having a thickness of 6 μm; the n-type contact layer 14a having a thickness of 2 μm with an electron concentration of $5\times10^{18}$ cm$^{-3}$ constituted by an Si-doped GaN initial layer and an Si-doped GaN regrown layer; the n-type cladding layer 14b having an Si concentration of $4\times10^{18}$ cm$^{-3}$ and having a superlattice structure constituted by twenty layers of 1.7 nm Ga$_{0.99}$In$_{0.01}$IN and nineteen layers of 1.7 nm GaN; the multiple quantum well structure (emission layer 15) constituted by six Si-doped GaN barrier layers (barrier layers 15a) having a thickness of 5 nm with GaN barrier layers disposed at both ends, six non-doped Ga$_{0.92}$In$_{0.08}$N well layers (well layers 15b) having a thickness of 2 nm, and the uppermost barrier layer (see the uppermost barrier layer 15a within the emission layer 15 shown in FIG. 4) including the final barrier layer made of non-doped GaN; and the p-type semiconductor layer 16 constituted by the p-type cladding layer 16a including four layers, made of non-doped Al$_{0.06}$Ga$_{0.94}$N, having a thickness of 2.5 nm and three layers, made of Mg-doped Al$_{0.01}$Ga$_{0.99}$N, having a thickness of 2.5 nm with a superlattice structure, and the p contact layer 16b, made of Mg-doped GaN, having a thickness of 20 nm.

Formation of the Electrode

Next, each of the electrodes for forming LEDs was formed on the epitaxial wafer (see the laminated semiconductor 10 shown in FIG. 4) in which the semiconductor layer 30 is formed on the substrate 2 by the above procedure.

That is, the translucent positive electrode 17 made of ITO was formed on the surface of the Mg-doped AlGaN layer (p-type semiconductor layer 16b) of the above epitaxial wafer by a photolithography technique heretofore known, and the positive electrode bonding pad 18 (p electrode bonding pad) having a structure laminated in the order of titanium, aluminum and gold was formed thereon, to thereby form the p-side electrode. Further, dry etching was performed on the wafer, and a region for forming an n-side electrode (negative electrode) of the n-type contact layer 14b was exposed, to thereby form the negative electrode bonding pad 19 (n-side electrode) on which four layers of Ni, Al, Ti and Au are laminated on the exposed region 14d in this order. By such a procedure, each of the electrodes having a shape as shown in FIG. 1 was formed on the wafer (see the laminated semiconductor 10 shown in FIG. 4).

Formation of the Protective Film

Next, the protective film 13 was formed on the wafer on which each of the electrodes was formed. In this case, the protective film 13 was formed so as to overall cover the semiconductor layer 30, the translucent positive electrode 17, the positive electrode bonding pad 18 and the negative electrode bonding pad 19. In this case, using a resist made of a general resin material as a material of the protective film 13, the semiconductor layer 30 was formed by a spin coater.

Removal of the Semiconductor Layer, the Buffer Layer and the Protective Film

Next, a portion corresponding to the scribing line 28 (see FIGS. 9 and 10) within the protective film 13, the semiconductor layer 30 and the buffer layer 12 was removed by irradiating the protective film 13 provided on the semiconductor layer 30 by the above procedure with a laser, to expose the substrate 2 (scribing line 28) of this portion.

In this case, while a laser having a wavelength of 266 nm was being applied at a pulse period of 50 KHz, the wafer was moved at a speed of 60 to 120 mm/sec, so that the laser irradiation position was moved along the position of the above scribing line 28, to give damage to this portion. Further, in this step, it was confirmed that the laser passed through the semiconductor layer and the buffer layer, and damage was also given onto the substrate 2 made of a sapphire, to thereby cause a groove (division groove) having a depth of about 20 µm to be formed in the substrate 2.

Next, by the above procedure, the wafer in which the protective film 13, the semiconductor layer 30 and the buffer layer 12 were divided into the device unit chips on the substrate 2 was immersed in a phosphoric acid treatment solution, and a portion of the division surface of the semiconductor layer 30 and the buffer layer 12 to which damage was given by a laser was etched and removed. In this case, by adjusting the etching conditions, the lateral side 30*a* of the semiconductor layer 30 and the lateral side 12*a* of the buffer layer 12 were formed in a reversely-inclined plane shape which was reversely-inclined from the substrate 2 toward the upper portion.

Next, the protective film 13 on the wafer was completely peeled and removed by exposing the above-mentioned wafer to oxygen plasma.

Grinding Step and Polishing Step

Next, mechanical grinding was performed on the lower surface 23 (second main surface) of the substrate 2 using a metal grinding wheel or a vitrified grinding wheel and the like having granularity of #170 to #2000 to set the whole thickness of the substrate 2 to 80 to 150 µm or so, and then polishing (lapping) was performed on the lower surface 23 by a polycrystalline diamond of a separation grinding wheel, to form the lower surface 23 of the substrate 2 in a specular surface shape.

Temporarily Fixing to the Sheet

Next, the lower surface 23 of the substrate 2 formed in a specular surface shape was attached and temporarily fixed onto the temporary fixing sheet 50 made of a resin material.

Formation of the Processing Marks in the Inside of the Substrate (Laser Processing)

Next, the temporary fixing sheet 50 to which the substrate 2 was attached was fixed to a sample table of a stealth laser processing apparatus. While the scribing line 28 which was a region in which the above semiconductor layer 30 was removed in the substrate 2 was being pulsed irradiation with a laser, the sample table, not shown, to which the temporary fixing sheet 50 was fixed was moved, so that the main surface 20 of the substrate 2 was irradiated with a laser along the scribing line 28, to form the processing marks 25 in the inside of the substrate 2. In this case, the wavelength of the laser was set to 355 nm, the pulse period was set to 25 kHz, and the movement speed of the sample table was set to be in a range of 100 to 200 mm/sec. The focal point of a laser was adjusted to the approximately central vicinity in the thickness direction of the substrate 2, and laser irradiation was performed. By such a procedure, the processing marks was generated in the inside of the substrate 2 at an interval of 4 to 15 µm, to form the lattice-shaped processing marks 25 by which the substrate can be divided into a plurality of chips in device units.

Division of the Wafer and Peeling of the Sheet

Next, using a breaker apparatus, the temporary fixing sheet 50 to which the wafer was attached was mounted on the mounting table of the breaker apparatus. Then, a blade was pressed from the upper side of the wafer along the processing marks 25 formed in the substrate 2 to apply stress, and the substrate 2 was broken along the processing marks 25, to dividing the wafer into a plurality of chips (light-emitting devices 1). The temporary fixing sheet 50 to which a plurality of chips divided was attached was detached from the breaker apparatus.

Next, the temporary fixing sheet 50 was mounted in an electrical heating apparatus and it was heated and expanded to separate each chip of a plurality of light-emitting devices 1 from each other at a predetermined distance, and then these chips of a plurality of light-emitting devices 1 were respectively detached from the temporary fixing sheet 50.

By the procedure mentioned above, the wafer in which the semiconductor layer 30 including the buffer layer 12 and the underlying layer 14*a*, the translucent positive electrode 17, the positive electrode bonding pad 18 and the negative electrode bonding pad 19 were provided on the substrate 2 was divided in a square shape having a side of 350 µm, to obtain the light-emitting device 1 as shown in FIG. 1. This light-emitting device 1 was disposed on the lead frame so that each of the electrodes was placed upward, and connected to the lead frame by a gold wire, to form a light-emitting diode (lamp 4) as shown in FIG. 15.

Evaluation of Characteristics of the Light-Emitting Device

When a forward current was caused to flow between the electrodes of the p-side (positive electrode bonding pad 18) and the n-side (negative electrode bonding pad 19) of the light-emitting diode produced in the above manner, a forward voltage at a current of 20 mA was 3.0 V. In addition, when the emission state was observed through the p-side translucent positive electrode 17, the emission wavelength was 455 nm, and the emission output was 22 mW. The characteristics of such a light-emitting diode was obtained without variation with respect to the light-emitting diode produced from the nearly whole surface of the produced wafer.

In addition, when the obtained chip (light-emitting device 1) was observed from the lateral side thereof using an optical microscope, in the end surface 2*a* of the substrate 2, the processing marks generated by a laser were confirmed at an interval of 4 to 15 µm or so from the main surface 20 side for epitaxially growing the semiconductor layer to a position of 10 to 50 µm or so. That is, it was confirmed that the asperity having a period of 4 to 15 µm was formed on the end surface 2*a* of the substrate 2 included in this chip, and that the end surface 2*a* was formed to have a rough surface. Thereby, it was obvious that the light-emitting device produced in the example would effectively emit light, incident on the substrate 2 side from the semiconductor layer 30, from the end surface 2*a*, and have a high light extraction efficiency and excellent emission property.

Comparative Example

Each of the layers was laminated on the substrate by the same procedure as that of the above example, the wafer was divided to create the light-emitting device chips, and then the lamp was produced, except that the step of forming the processing marks through the laser processing step as in the above example was not performed, the substrate was cut simultaneously with laser irradiation in the semiconductor layer removal step, etching was performed on the cross section after cutting, and the end surface of the substrate was formed to have a smooth flat surface.

Similarly to the above example, when a forward current was caused to flow between the p-side electrode and the n-side electrode, a forward voltage at a current of 20 mA was 3.0 V. In addition, when the emission state was observed through the p-side translucent positive electrode 17, the emission wavelength was 455 nm, and the emission output was 18 mW.

Though the characteristics of such a light-emitting diode were obtained without variation with respect to the light-emitting diode produced from the nearly whole surface of the produced wafer, the emission output was inferior to that of the example as a result.

In addition, when the obtained chip was observed from the lateral side thereof by an optical microscope, the end surface of the substrate was formed to have approximately smooth surface, the large processing marks and the like were not confirmed.

From these results, it was obvious that in the light-emitting device of the comparative example, since light emitted from the semiconductor layer toward the substrate side and propagated in the substrate would be difficult to be emitted from the lateral side of the substrate, the emission output thereof was inferior.

From the above results, it is obvious that the group-III nitride semiconductor light-emitting device obtained by the manufacturing method according to the invention has a high light extraction efficiency and an excellent emission property.

REFERENCE SIGNS LIST

1: group-III nitride semiconductor light-emitting device (light-emitting device, chip)
10: laminated semiconductor (group-III nitride semiconductor device)
2: substrate
2a: end surface
20: main surface (first main surface)
21: flat surface
22: raised portion
23: lower surface (second main surface)
25: processing marks
28: scribing line (cutting expectation line)
12: buffer layer
12a: lateral side (buffer layer)
14: n-type semiconductor layer
14d: negative electrode forming region
15: emission layer
16: p-type semiconductor layer
17: translucent positive electrode
18: positive electrode bonding pad
19: negative electrode bonding pad
13: protective film
30: semiconductor layer
30a: lateral side (semiconductor layer)
4: lamp
50: temporary fixing sheet

The invention claimed is:

1. A method of manufacturing a group-III nitride semiconductor light-emitting device in which a semiconductor layer is formed on a substrate by sequentially laminating an n-type semiconductor layer, an emission layer and a p-type semiconductor layer, which are made of a group-III nitride semiconductor, the method comprising:
   an epitaxial step of epitaxially growing the group-III nitride semiconductor on a first main surface of the substrate, to form the semiconductor layer so as to cover the first main surface;
   a masking step of forming a protective film on the semiconductor layer;
   a semiconductor layer removal step of irradiating a cutting expectation line for dividing the substrate into a plurality of chips with a laser from the side on which the semiconductor layer and the protective film of the substrate are formed, to remove the protective film and the semiconductor layer and expose the substrate;
   a grinding step of grinding a second main surface of the substrate, to reduce a thickness of the substrate;
   a polishing step of polishing the substrate after the grinding step;
   a laser processing step of irradiating the cutting expectation line with a laser, to provide processing marks to the inside of the substrate; and
   a division step of dividing the substrate along the processing marks and the cutting expectation line, to create a plurality of chips while forming a division surface of the substrate to have a rough surface,
   wherein the first main surface of the substrate comprises a flat surface of a C-plane and a plurality of raised portions formed on the C-plane.

2. The method of manufacturing a group-III nitride semiconductor light-emitting device according to claim 1, wherein the substrate is a substrate in which a plane orientation of the substrate surface has an off-angle within a range of ±3° from the (0001) direction.

3. The method of manufacturing a group-III nitride semiconductor light-emitting device according to claim 1, wherein the laser processing step comprises providing the processing marks to a region from a irradiation surface of the laser in the substrate to a ⅔ portion in the thickness direction thereof.

4. The method of manufacturing a group-III nitride semiconductor light-emitting device according to claim 1, further comprising an etching step of etching the lateral side of the semiconductor layer in which a portion along the scribing line for dividing the substrate is removed between the semiconductor layer removal step and the grinding step by the semiconductor layer removal step.

5. The method of manufacturing a group-III nitride semiconductor light-emitting device according to claim 4, wherein the etching step uses wet etching by immersing the semiconductor layer in a phosphoric acid treatment solution.

6. The method of manufacturing a group-III nitride semiconductor light-emitting device according to claim 4, wherein the etching step comprises forming the lateral side of the semiconductor layer in a reversely-inclined plane shape which is reversely inclined from the first main surface of the substrate toward the side on which the semiconductor layer is formed.

7. The method of manufacturing a group-III nitride semiconductor light-emitting device according to claim 1, further comprising a temporary fixing step of attaching a temporary fixing sheet made of a resin to either of the substrate side or the semiconductor layer side, between the polishing step and the laser processing step, and
   a sheet peeling step of, after the plurality of chips is separated from each other by heating and expanding the temporary fixing sheet subsequently to the division step, detaching the chips from the temporary fixing sheet.

8. The method of manufacturing a group-III nitride semiconductor light-emitting device according to claim 4, further comprising a buffer layer forming step of laminating a buffer layer made of $Al_XGa_{1-X}N$ ($1 \geq X \geq 0$) on the first main surface of the substrate by a reactive sputtering method so as to cover the first main surface, before at least the epitaxial step, wherein the semiconductor layer removal step comprises irradiating the cutting expectation line for dividing the substrate into a plurality of chips with a laser from the side on which the semiconductor layer and the protective film of the substrate are formed, to remove the protective film, the semiconductor layer and the buffer layer and expose the substrate, and the etching step comprises etching the lateral sides of the semiconductor layer and the buffer layer on which a portion along the scribing line for dividing the substrate is removed in the semiconductor layer removal step.

\* \* \* \* \*